(12) United States Patent
Miyairi et al.

(10) Patent No.: US 7,994,021 B2
(45) Date of Patent: Aug. 9, 2011

(54) METHOD OF MANUFACTURING SEMICONDUCTOR DEVICE

(75) Inventors: Hidekazu Miyairi, Kanagawa (JP); Hironobu Shoji, Tokyo (JP); Akihisa Shimomura, Kanagawa (JP); Eiji Higa, Kanagawa (JP); Tomoaki Moriwaka, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 687 days.

(21) Appl. No.: 11/881,285

(22) Filed: Jul. 25, 2007

(65) Prior Publication Data

US 2008/0026543 A1    Jan. 31, 2008

(30) Foreign Application Priority Data

Jul. 28, 2006  (JP) .................................. 2006-206505

(51) Int. Cl.
*H01L 21/00* (2006.01)
(52) U.S. Cl. ........................ 438/455; 438/689; 438/690
(58) Field of Classification Search .................. 438/455, 438/689, 690
See application file for complete search history.

(56) References Cited

U.S. PATENT DOCUMENTS

| | | | |
|---|---|---|---|
| 4,594,471 A | | 6/1986 | Yamazaki |
| 4,603,470 A | | 8/1986 | Yamazaki |
| 4,725,558 A | | 2/1988 | Yamazaki et al. |
| 4,752,455 A | * | 6/1988 | Mayer ........................ 427/597 |
| 4,861,964 A | | 8/1989 | Sinohara |
| 4,895,735 A | * | 1/1990 | Cook .......................... 427/597 |
| 4,927,493 A | | 5/1990 | Yamazaki et al. |
| 4,937,129 A | | 6/1990 | Yamazaki |
| 4,954,217 A | | 9/1990 | Yamazaki et al. |
| 4,970,196 A | * | 11/1990 | Kim et al. .................... 505/474 |
| 4,970,368 A | | 11/1990 | Yamazaki et al. |
| 4,975,145 A | | 12/1990 | Yamazaki et al. |
| 4,987,006 A | * | 1/1991 | Williams et al. ............. 427/597 |
| 5,035,202 A | * | 7/1991 | Nishikawa et al. ........... 118/727 |
| 5,089,426 A | | 2/1992 | Yamazaki et al. |
| 5,171,650 A | * | 12/1992 | Ellis et al. ...................... 430/20 |
| 5,173,441 A | * | 12/1992 | Yu et al. ...................... 438/676 |
| 5,187,601 A | | 2/1993 | Yamazaki et al. |

(Continued)

FOREIGN PATENT DOCUMENTS

JP              05-144812           6/1993

(Continued)

OTHER PUBLICATIONS

Oh, C-H et al., "Preparation of Position-Controlled Crystal-Silicon Island Arrays by Means of Excimer-Laser Annealing," Japanese Journal of Applied Physics, vol. 37, Part 1, No. 10, Oct. 1998, pp. 5474-5479.

(Continued)

*Primary Examiner* — Laura M Menz
(74) *Attorney, Agent, or Firm* — Hush Blackwell LLP

(57) ABSTRACT

A method of forming a semiconductor device is provided, including a step of forming a layer which absorbs light over one face of a first substrate, a step of providing a second substrate over the layer which absorbs light, a step of providing a mask to oppose the other face of the first substrate, and a step of transferring the part of the layer which absorbs light to the second substrate by irradiating the layer which absorbs light with a laser beam through the mask.

8 Claims, 31 Drawing Sheets

U.S. PATENT DOCUMENTS

| | | | |
|---|---|---|---|
| 5,292,559 A * | 3/1994 | Joyce et al. | 427/597 |
| 5,313,043 A * | 5/1994 | Yamagishi | 219/121.68 |
| 5,501,938 A * | 3/1996 | Ellis et al. | 430/201 |
| 5,567,336 A * | 10/1996 | Tatah | 219/121.66 |
| 5,585,949 A | 12/1996 | Yamazaki et al. | |
| 5,587,822 A * | 12/1996 | Lee | 349/124 |
| 5,683,601 A * | 11/1997 | Tatah | 219/121.85 |
| 5,708,252 A | 1/1998 | Shinohara et al. | |
| 5,866,444 A | 2/1999 | Yamazaki et al. | |
| 5,935,462 A * | 8/1999 | Tatah | 219/121.6 |
| 5,958,268 A * | 9/1999 | Engelsberg et al. | 219/121.84 |
| 6,048,588 A * | 4/2000 | Engelsberg | 427/554 |
| 6,149,988 A | 11/2000 | Shinohara et al. | |
| 6,159,832 A | 12/2000 | Mayer | 438/584 |
| 6,177,151 B1 * | 1/2001 | Chrisey et al. | 427/596 |
| 6,261,856 B1 | 7/2001 | Shinohara et al. | |
| 6,335,151 B1 * | 1/2002 | Ausschnitt et al. | 430/322 |
| 6,372,608 B1 | 4/2002 | Shimoda et al. | |
| 6,445,005 B1 | 9/2002 | Yamazaki et al. | |
| 6,462,723 B1 * | 10/2002 | Yamazaki et al. | 345/82 |
| 6,597,509 B2 * | 7/2003 | Takakuwa et al. | 359/619 |
| 6,603,453 B2 * | 8/2003 | Yamazaki et al. | 345/92 |
| 6,641,933 B1 | 11/2003 | Yamazaki et al. | |
| 6,645,830 B2 | 11/2003 | Shimoda et al. | |
| 6,670,637 B2 | 12/2003 | Yamazaki et al. | |
| 6,700,631 B1 | 3/2004 | Inoue et al. | |
| 6,726,517 B2 * | 4/2004 | Yamada et al. | 445/24 |
| 6,762,124 B2 * | 7/2004 | Kian et al. | 438/690 |
| 6,774,884 B2 | 8/2004 | Shimoda et al. | |
| 6,818,530 B2 | 11/2004 | Shimoda et al. | |
| 6,885,389 B2 | 4/2005 | Inoue et al. | |
| 6,894,312 B2 | 5/2005 | Yamazaki et al. | |
| 6,960,787 B2 * | 11/2005 | Yamazaki et al. | 257/59 |
| 7,094,665 B2 | 8/2006 | Shimoda et al. | |
| 7,112,115 B1 | 9/2006 | Yamazaki et al. | |
| 7,112,374 B2 | 9/2006 | Yamazaki et al. | |
| 7,176,069 B2 | 2/2007 | Yamazaki et al. | |
| 7,180,197 B2 | 2/2007 | Nishi et al. | |
| 7,187,495 B2 * | 3/2007 | Shimizu | 359/460 |
| 7,199,516 B2 | 4/2007 | Seo et al. | |
| 7,202,155 B2 | 4/2007 | Fukuchi | |
| 7,226,819 B2 | 6/2007 | Maekawa et al. | |
| 7,233,439 B2 * | 6/2007 | Shimizu | 359/456 |
| 7,247,882 B2 * | 7/2007 | Yamazaki et al. | 257/72 |
| 7,377,656 B2 * | 5/2008 | Nojima et al. | 353/77 |
| 2002/0141067 A1 * | 10/2002 | Takakuwa et al. | 359/619 |
| 2003/0001832 A1 * | 1/2003 | Yamazaki et al. | 345/204 |
| 2004/0080481 A1 * | 4/2004 | Yamazaki et al. | 345/92 |
| 2005/0043186 A1 | 2/2005 | Maekawa et al. | |
| 2005/0083571 A1 * | 4/2005 | Shimizu | 359/456 |
| 2005/0083572 A1 * | 4/2005 | Shimizu | 359/460 |
| 2005/0158929 A1 * | 7/2005 | Yamazaki et al. | 438/166 |
| 2006/0028622 A1 * | 2/2006 | Nojima et al. | 353/75 |
| 2006/0030152 A1 * | 2/2006 | Yoshimura et al. | 438/689 |
| 2006/0158482 A1 | 7/2006 | Nakamura et al. | |
| 2006/0163743 A1 | 7/2006 | Kuwabara et al. | |
| 2006/0270175 A1 | 11/2006 | Aoki et al. | |
| 2007/0051952 A1 | 3/2007 | Yamazaki et al. | |
| 2008/0026543 A1 * | 1/2008 | Miyairi et al. | 438/455 |
| 2008/0057718 A1 * | 3/2008 | Omata et al. | 438/694 |
| 2008/0182207 A1 | 7/2008 | Yamazaki et al. | |
| 2008/0182349 A1 | 7/2008 | Yamazaki et al. | |
| 2009/0040400 A1 * | 2/2009 | Nakagawa et al. | 349/5 |
| 2009/0152743 A1 * | 6/2009 | Jomaa et al. | 257/782 |
| 2010/0060553 A1 * | 3/2010 | Zimmerman et al. | 345/60 |

FOREIGN PATENT DOCUMENTS

| | | |
|---|---|---|
| JP | 11-243209 | 9/1999 |
| JP | 2000-031013 | 1/2000 |
| JP | 2000-031624 | 1/2000 |
| JP | 2000-133636 | 5/2000 |
| JP | 2002-164591 | 6/2002 |
| JP | 2004286466 A * | 10/2004 |

OTHER PUBLICATIONS

Jyumonji, M. et al., "Optimum Light Intensity Distribution for Growing Large SI Grains by Phase-Modulated Excimer-Laser Annealing," Japanese Journal of Applied Physics, vol. 43, No. 2, 2004, pp. 739-744.

Nakata, M. et al., "A New Nucleation-Site-Control Excimer-Laser-Crystallization Method," Japanese Journal of Applied Physics, vol. 40, Part 1, No. 5A, May 2001, pp. 3049-3054.

Office Action re Chinese application No. CN 200710138353.8, dated Aug. 28, 2009 (with English translation).

Yamazaki, S. et al., "Mask-Less Fabrication of A-Si Solar Cell Using Laser Scribe Process," Conference Record of the 17th IEEE PVSC (Photovoltaic Specialists Conference), May 1, 1984, pp. 206-211.

Yamazaki, S. et al., "Fabrication of the Large-Area Integrated A-Si Solar Cells," Mat. Res. Soc. Symp. Proc. (Materials Research Society Symposia Proceedings), vol. 70, 1986, pp. 487-492.

* cited by examiner

METHOD OF MANUFACTURING SEMICONDUCTOR DEVICE

BACKGROUND OF THE INVENTION

1. Field of the Invention

The present invention relates to a method of manufacturing a layer such as a conductive layer, semiconductor layer, or an insulating layer, which is formed by a transfer method using a laser beam, or the like. Further, the invention relates to a semiconductor device having a semiconductor element, which is formed using such layers.

2. Description of the Related Art

Conventionally, a so-called active matrix drive display panel or a semiconductor integrated circuit each of which has a semiconductor element typified by a thin film transistor (hereinafter also referred to as a "TFT") or a MOS transistor is manufactured by forming a resist mask through light-exposure steps using a photomask (hereinafter referred to as a photolithography process) and then selectively etching each thin film.

In a photolithography process, a resist mask is formed by coating the entire surface of a substrate with a resist, prebaking the substrate, irradiating the resist with an ultraviolet ray or the like through a photomask, and then developing it. After that, a thin film (thin film formed of a semiconductor material, an insulating material, or a conductive material) which is present except in a portion to be a semiconductor layer or a wiring is etched to be removed using the resist mask as a mask, thereby the semiconductor layer or the wiring is formed (Reference 1: Japanese Published Patent Application No. 05-144812).

SUMMARY OF THE INVENTION

However, in steps of forming wirings, semiconductor layers, insulating layers, using a conventional photolithography process, most of the material of a resist is wasted, and further, the number of steps of forming a wiring, a semiconductor layer, and an insulating layer, or the like is large; thus, throughput is reduced.

Further, when forming a semiconductor layer with a desired shape by etching a semiconductor film using the conventional photolithography process, the surface of the semiconductor film is coated with a resist. At that time, there is a problem in that the surface of the semiconductor film is directly exposed to the resist, and thus the semiconductor film is contaminated by impurities such as oxygen, carbon, heavy-metal elements, and the like which is contained in the resist. In the contamination, impurity elements are mixed into the semiconductor film, which would deteriorate the characteristics of the semiconductor element. In particular, as for TFTS, there is a problem in that this contamination causes variations and deterioration of the transistor characteristics.

The present invention has been made in view of such conditions, and provides a method of forming a semiconductor device such that the number of steps is small and cost can be reduced. Further, the invention provides a method of forming a semiconductor device including a semiconductor element having a semiconductor layer with a desired shape without using a resist. Further, a method of manufacturing a semiconductor device is provided such that the efficiency of repairing defects of a wiring formed over a substrate can be increased and yield and mass productivity can be increased. Moreover, a method of manufacturing a semiconductor device, which can enhance throughput and increase mass productivity is provided.

In accordance with the present invention, a light absorbing layer is formed over one face of a light-transmitting substrate, and the light absorbing layer is irradiated with a laser beam from the other face side of the light-transmitting substrate through a mask. Due to the irradiation, the energy of the laser beam is absorbed in the light absorbing layer. Part of the light absorbing layer is dissociated by release of gas in the light absorbing layer or sublimation of the light absorbing layer due to the energy, or the like, and the part of the light absorbing layer is separated from the light-transmitting substrate, and the part of the light absorbing layer is selectively transferred to thereby forming a layer over the substrate.

Note that another layer may be provided so as to be in contact with the light absorbing layer, and the light absorbing layer may be irradiated with a laser beam from the light-transmitting substrate side through the mask similarly. In this case, due to the irradiation, the energy of the laser beam is absorbed in the light absorbing layer. Part of the light absorbing layer and part of a layer in contact with the light absorbing layer are dissociated by release of gas in the light absorbing layer or sublimation of the light absorbing layer due to the energy, or the like, and the part of the light absorbing layer and the part of the layer in contact with the light absorbing layer are separated from the light-transmitting substrate, and they are selectively transferred to a substrate opposite to the light-transmitting substrate thereby forming a layer over the substrate.

Alternatively, another layer may be provided so as to be in contact with the light absorbing layer, and the light absorbing layer may be irradiated with a laser beam from the light-transmitting substrate side through the mask similarly, thereby part of a layer in contact with the light absorbing layer is dissociated, the part of the layer in contact with the light absorbing layer is separated from the light absorbing layer, and it is selectively transferred to a substrate opposite to the light-transmitting substrate thereby forming a layer over the substrate.

The light absorbing layer is a conductive layer, a semiconductor layer, or an insulating layer, which absorb a laser beam. Further, the layer in contact with the light absorbing layer is formed of one or more of a conductive layer, a semiconductor layer, and an insulating layer.

A binary mask, a phase shift mask, or the like is used as the mask. Further, a laminate of a binary mask and phase shift mask can be used. Furthermore, a mask having a microlens and a light blocking layer near the periphery of the microlens can be used.

The laser beam irradiation can be performed in a vacuum atmosphere by placing the light-transmitting substrate and the substrate in a vacuum atmosphere. Further, the substrate can be irradiated with a laser beam while it is heated. Furthermore, the substrate can be irradiated with a laser beam in a vacuum atmosphere while it is heated.

In the present invention, a light absorbing layer is formed over a light-transmitting substrate, and the light absorbing layer is irradiated with a laser beam; thus, a part of the light absorbing layer, which corresponds to the region irradiated with the laser beam, can be transferred to a substrate opposite to the light-transmitting substrate. Therefore, a layer having a desired shape can be formed at a predetermined area without the use of a known photolithography process.

Further, in the present invention a first layer which absorbs light is formed over a light-transmitting substrate, a second layer in contact with the first layer is formed, and the light absorbing layer is irradiated with a laser beam; thus, a part of the second layer, which corresponds to the region irradiated with the laser beam can be transferred to a substrate opposite to the light-transmitting substrate. Therefore, a layer having a desired shape can be formed at a predetermined area without the use of a known photolithography process.

Further, in the present invention a first layer which absorbs light is formed over a light-transmitting substrate, a second layer in contact with the first layer is formed, and the light absorbing layer is irradiated with a laser beam; thus, a part of the first layer which absorbs light and a part of the second layer, which correspond to the region irradiated with the laser beam can be transferred to a substrate opposite to the light-transmitting substrate. Therefore, a layer having a desired shape can be formed at a predetermined area without the use of a known photolithography process.

Further, when the light absorbing layer is irradiated with a laser beam with a large beam spot area, such as a linear laser beam, a rectangular laser beam, a plane laser beam, or the like, a plurality of regions of the light absorbing layer can be irradiated with a laser beam in a short time; thus, semiconductor devices can be manufactured with high mass productivity.

Further, when the light absorbing layer is a semiconductor layer, a semiconductor layer having a desired shape can be formed over a substrate while preventing mixing of an impurity element into the semiconductor film due to resist coating, and a semiconductor element can be formed by using the semiconductor layer. Therefore, highly integrated semiconductor devices with less variation of the characteristics can be manufactured with high mass productivity.

Further, a layer having a desired shape can be formed without the use of a photolithography process using a resist, and a semiconductor element can be formed by using the layer. Accordingly, the number of process steps can be reduced, and the amount of material to be used can be reduced. Consequently, cost can be reduced.

In addition, liquid crystal televisions and EL televisions which include semiconductor devices formed through the above manufacturing steps can be manufactured at low cost.

DETAILED DESCRIPTION OF THE INVENTION

Ways of implementing the present invention will be described with reference to the drawings. Note that the present invention can be implemented in many different ways, and it is easily understood by those skilled in the art that the modes and details can be various modified without departing from the spirit and the scope of the present invention. Therefore, the present invention should not be construed as being limited to the description of the embodiments and the embodiment modes.

Embodiment Mode 1

In this embodiment mode, steps of selectively forming a layer having a given shape over a substrate without using a photolithography process will be described below. FIGS. 1A to 4C are cross-sectional views illustrating steps of selectively forming a layer over a substrate.

Figure 1A:
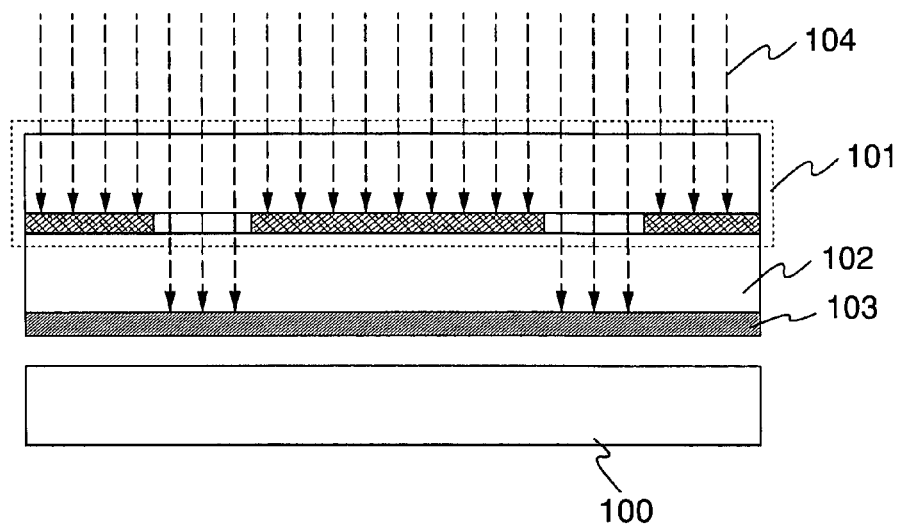
FIGS. 1A and 1B are cross-sectional views illustrating a method of manufacturing a semiconductor device of the present invention.

As shown in FIG. 1A, a light absorbing layer 103 is formed over one face of a light-transmitting substrate. Further, a mask 101 is provided on the other face side of the light-transmitting substrate 102. A substrate 100 is provided so as to oppose the light absorbing layer 103. Note that the one face and the other face of the light-transmitting substrate 102 oppose each other.

A substrate which transmits light of a laser beam to be applied later can be used as the light-transmitting substrate 102. Accordingly, a substrate which does not absorb the wavelength of the laser beam to be formed later may be used as appropriate. As typical examples of the light-transmitting substrate 102, there are a quartz substrate, a glass substrate, a resin substrate, and the like.

The light absorbing layer is formed using a material which absorbs a laser beam to be applied later. As a material which absorbs a laser beam, a material having a band gap energy lower than the energy of the laser beam to be applied is used.

As the light absorbing layer, an element selected from titanium (Ti), aluminum (Al), tantalum (Ta), tungsten (W), molybdenum (Mo), copper (Cu), chromium (Cr), neodymium (Nd), iron (Fe), nickel (Ni), cobalt (Co), ruthenium (Ru), rhodium (Rh), palladium (Pd), osmium (Os), iridium (Ir), silver (Ag), gold (Au), platinum (Pt), cadmium (Cd), zinc (Zn), silicon (Si), germanium (Ge), zirconium (Zr), and barium (Ba). Further, an alloy material, a nitrogen compound, an oxygen compound, or a carbon compound, which contain the element as a main component can be used. Alternatively, a single layer of a halogen compound can be used. A laminate of them can also be used. Further, an insulating film in which particles capable of absorbing light are dispersed, typically, a silicon oxide film in which microcrystalline silicon is dispersed can be used. Moreover, an insulating layer in which a coloring matter is dissolved or dispersed in an insulator can be used.

For the light absorbing layer, a material which absorbs a laser beam to be applied later and of which a part of the light absorbing layer or a part of the layer in contact with the light absorbing layer can be dissociated by release of gas in the light absorbing layer or sublimation of the light absorbing layer due to the energy of the laser beam is used; thus, the transfer of the light absorbing layer becomes easier.

As the light absorbing layer of which gas can be released due to the energy of the laser beam, a layer formed of a material containing at least one of hydrogen and a rare gas element can be used. Generally, a semiconductor layer containing hydrogen, a conductive layer containing rare gas or hydrogen, an insulating layer containing rare gas or hydrogen, or the like can be used. In this case, part of the light absorbing layer is dissociated upon release of gas in the light absorbing layer; therefore, the light absorbing layer can be transferred easily.

As the light absorbing layer which can be sublimed by the energy of the laser beam, a material having a low sublimation point of approximately 100° C. to 2000° C. is preferably used. Further, a material having a melting point of 1500° C. to 3500° C. and a thermal conductivity of 0.1 W/mK to 100 W/mK can be used. As the sublimable light absorbing layer, as an example of a material having a low sublimation point of approximately 100° C. to 2000° C., there are aluminum nitride, zinc oxide, zinc sulfide, silicon nitride, mercuric sulfide, aluminum chloride, and the like. As the material having a melting point of 1000° C. to 2000° C. and a thermal conductivity of 5 W/mK to 100 W/mK, germanium (Ge), silicon oxide, chromium (Cr), titanium (Ti), or the like can be used.

The light absorbing layer 103 can be formed by a coating method, an electroplating method, a PVD (Physical Vapor Deposition) method, or a CVD (Chemical Vapor Deposition) method.

As the mask 101, a mask capable of selectively transmitting a laser beam 104, a mask capable of selectively controlling the phase difference in a laser beam, or a mask on which the laser beam 104 can be selectively focused can be used as appropriate.

As the substrate 100, a glass substrate, a plastic substrate, a metal substrate, a ceramic substrate, or the like can be used as appropriate.

Next, the light absorbing layer 103 is irradiated with the laser beam 104 through the mask 101 and the light-transmitting substrate 102 from the mask 101 side.

As the laser beam 104, a laser beam having an energy which is absorbed by the light absorbing layer 103 is used as appropriate. Generally, a laser beam of an ultraviolet region, a visible region, or an infrared region is applied as appropriate.

As a laser oscillator capable of emitting such a laser beam, an oscillator of an excimer laser of ArF, KrF, XeCl, or the like; an oscillator of a gas laser of He, He—Cd, Ar, He—Ne, HF, or the like; a solid-state laser oscillator using a single crystal such as YAG, YVO$_4$, forsterite (Mg$_2$SiO$_4$), YAlO$_3$, or GdVO$_4$ or a polycrystal (ceramic) such as YAG, Y$_2$O$_3$, YVO$_4$, YAlO$_3$, or GdVO$_4$, to which one or more of Nd, Yb, Cr, Ti, Ho, Er, Tm, and Ta is added as a dopant as a medium; or an oscillator of a semiconductor laser of GaN, GaAs, GaAlAs, InGaAsP, or the like can be used. Note that as to the solid-state laser oscillator, a fundamental wave to the fifth harmonic is preferably applied.

Further, as the laser beam 104, a continuous wave laser beam or a pulsed laser beam can be used as appropriate. As to the pulsed laser beam, a frequency band of several dozen Hz to several hundred Hz is generally used; however, a pulsed laser beam having a repetition rate of 10 MHz or more which is significantly higher than the general frequency band, or a repetition rate of a pulse width of picoseconds or femtoseconds ($10^{-15}$ second) may be used.

The cross-sectional shape of the laser beam 104 may be circular, elliptical, rectangular, or linear (specifically, a long and narrow rectangle) as appropriate. Further, the laser beam is preferably processed to have such a cross-sectional shape using an optical system.

The laser beam 104 preferably has energy or power sufficient for release of gas in the light absorbing layer, sublimation of the light absorbing layer, or the like.

In order to transfer a layer to a desired region over the substrate, a laser beam may be scanned two-dimensionally while fixing the substrate, the light-transmitting substrate, and the mask. Alternatively, a layer having a desired shape can be transferred to the substrate by two-dimensionally moving the light-transmitting substrate and the substrate while fixing the mask and an area to be irradiated with the laser beam.

Irradiation with the laser beam 104 can be performed under atmospheric pressure or under reduced pressure. When the irradiation is performed under reduced pressure, transfer of the light absorbing layer becomes easier. Moreover, the light absorbing layer 103 may be irradiated with the laser beam while heating the substrate 100, which also makes it easier to transfer the light absorbing layer.

Figure 1B:
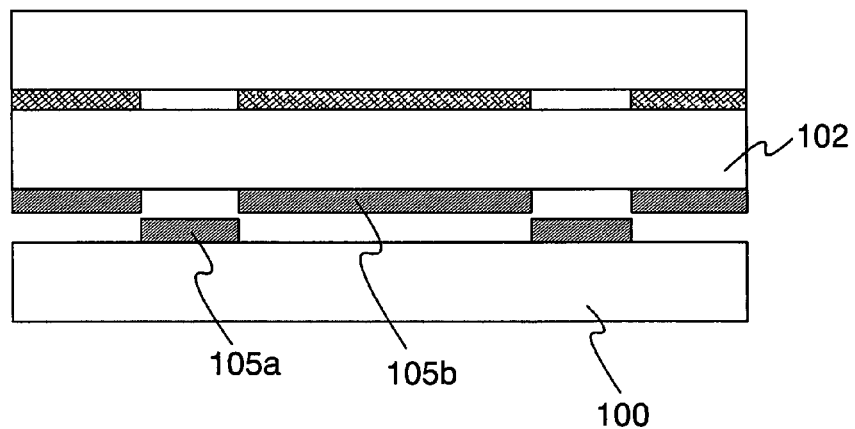

As a result, the light absorbing layer 103 absorbs the laser beam 104, and part of the light absorbing layer 103 is dissociated due to the energy of the laser beam 104; thus, a layer 105a can be transferred onto the substrate 100 as shown in FIG. 1B. Further, a remaining portion 105b of the light absorbing layer remains on the light-transmitting substrate 102. Note that after the layer 105a is transferred onto the substrate 100, the layer 105a may be irradiated with a laser beam. Further, after the layer 105a is transferred onto the substrate, the layer 105a may be heated. Through such steps, the adhesion between a transferred layer and the substrate can be increased. Further, the density of the transferred layer can be increased. In addition, when the transfer layer 105a is a semiconductor layer, a microcrystalline semiconductor layer in which crystal grains of 0.5 nm to 20 nm can be observed in a crystalline semiconductor layer or an amorphous semiconductor layer can be formed.

Note that here, as to transfer using a laser beam, there are also cases where the light absorbing layer irradiated with the laser beam is not dissociated in an absorption region which absorbs the energy of the laser beam and dissociated only at the interface between the absorption region and a non-absorption region and then transferred to the substrate, or cases where the light absorbing layer is dissociated in the absorption region which absorbs the energy of the laser beam and then transferred to the substrate. Further, there are cases where the light absorbing layer irradiated with the laser beam absorbs the energy of the laser beam and melted and evaporated and then transferred to the substrate.

Through the above steps, a layer can be formed over a substrate selectively using part of a light absorbing layer without using a photolithography process.

Next, a method of selectively transferring a light absorbing layer and a layer in contact with the light absorbing layer onto a substrate will be described with reference to FIGS. 2A and 2B.

Figure 2A:
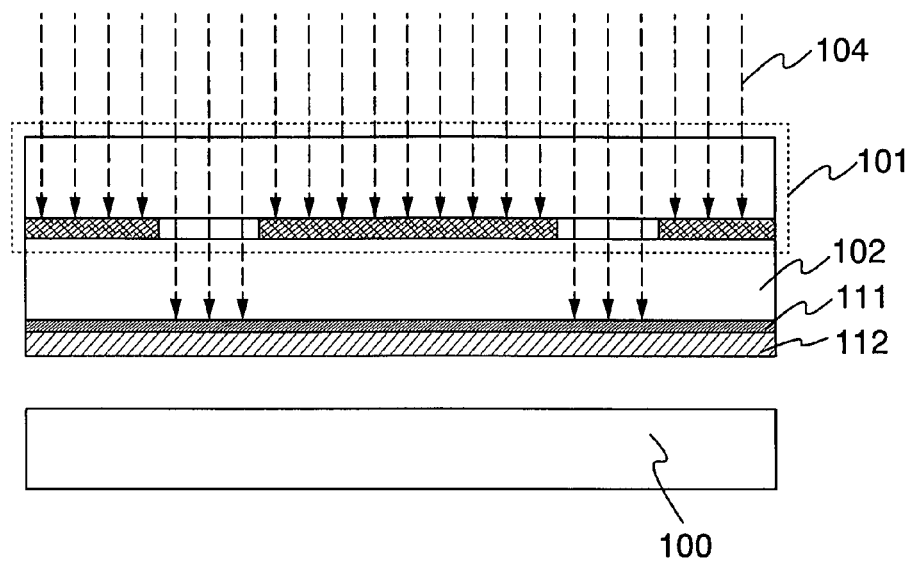
FIGS. 2A and 2B are cross-sectional views illustrating a method of manufacturing a semiconductor device of the present invention.
Figure 2B:
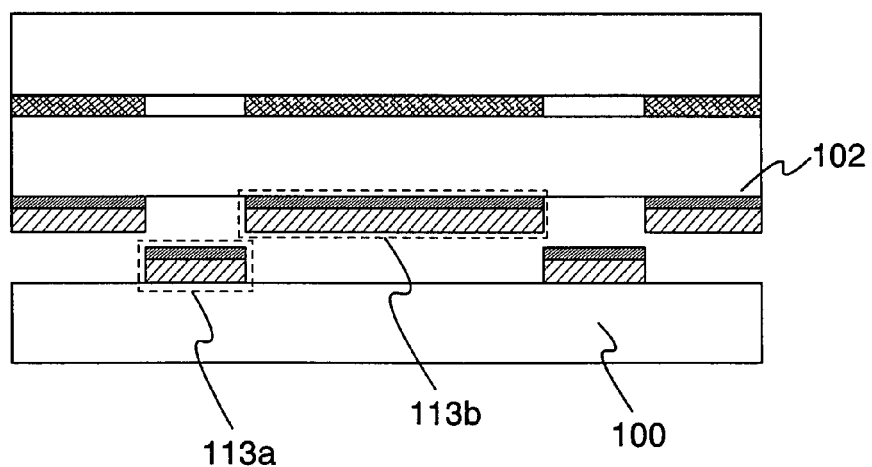
Figure 3A:
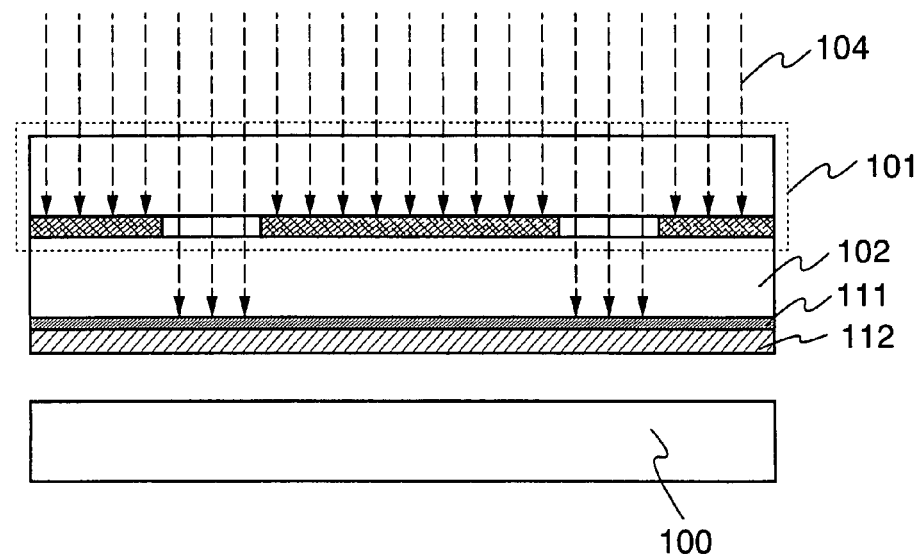
FIGS. 3A and 3B are cross-sectional views illustrating a method of manufacturing a semiconductor device of the present invention.
Figure 3B:
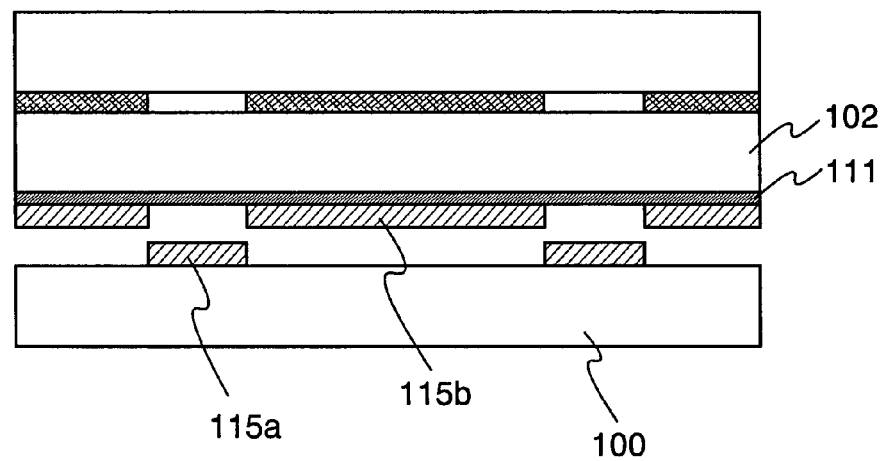

As shown in FIG. 2A, a light absorbing layer 111 and a layer 112 in contact with the light absorbing layer 111 on one face of the light-transmitting substrate 102. A mask 101 is provided over the other face side of the light-transmitting substrate 102. Further, a substrate 100 is provided so as to oppose the layer 112 in contact with the light absorbing layer 111.

Here, the same material as the light absorbing layer 103 shown in FIGS. 1A and 1B can be used for the light absorbing layer 111.

The layer 112 in contact with the light absorbing layer 111 can be formed of a conductive layer, a semiconductor layer, or an insulating layer as appropriate. Further, the layer 112 in contact with the light absorbing layer 111 may be not only a single layer but also a multilayer laminate of a plurality of layers.

Next, the light absorbing layer 111 is irradiated with the laser beam 104 through the mask 101 and the light-transmitting substrate 102 from the mask 101 side.

As a result, the light absorbing layer 111 absorbs the laser beam 104, and part of the light absorbing layer 111 is dissociated due to the energy of the laser beam 104. At that time, the energy is also delivered to the layer 112 in contact with the light absorbing layer 111; thus, the layer 113a can be transferred onto the substrate 100 as shown in FIG. 2B. Further, a remaining portion 113b of the light absorbing layer 111 and the layer 112 in contact with the light absorbing layer 111 remain on the light-transmitting substrate 102.

Note that in FIG. 2, the light absorbing layer 111 and the layer 112 in contact with the light absorbing layer 111 are transferred to the substrate 100; however, the invention is not limited thereto.

As shown in FIG. 3, only a part 115a of the layer 112 in contact with the light absorbing layer 111 may be transferred onto the substrate 100, and the light absorbing layer 111 may remain on the light-transmitting substrate 102.

Note that in FIGS. 1A to 3B, a light-transmitting substrate and a mask are separate; however, the invention is not limited thereto, and a mask may be formed on the light-transmitting substrate. Specifically, a light absorbing layer may be formed on one face of the light-transmitting substrate, and a mask may be formed on the other face of the light-transmitting substrate. As typical examples of a mask, there are a light blocking layer, a reflective layer, a microlens, a phase shift mask, and the like.

Through the above steps, a layer can be selectively formed over a substrate using part of a layer in contact with a light absorbing layer without using a photolithography process. As a result, even a layer which does not absorb light can be selectively transferred onto the substrate by providing the layer so as to be in contact with the light absorbing layer.

Figure 4A:
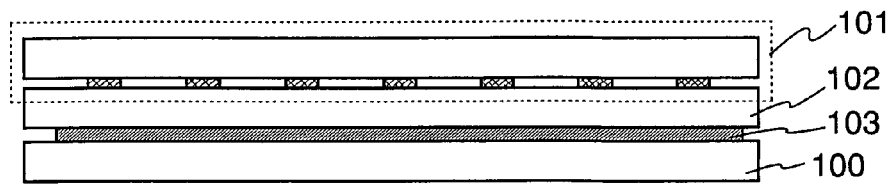
FIGS. 4A to 4C are cross-sectional views illustrating a method of manufacturing a semiconductor device of the present invention.
Figure 4B:
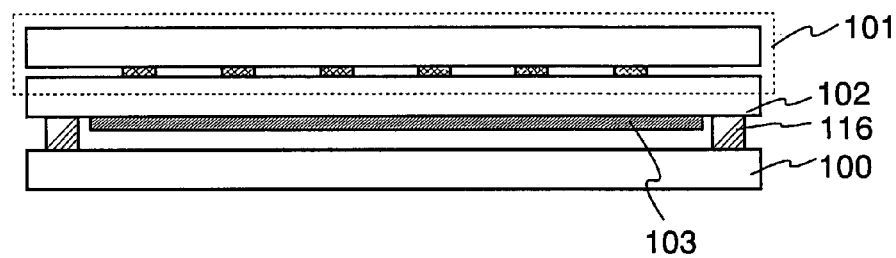
Figure 4C:
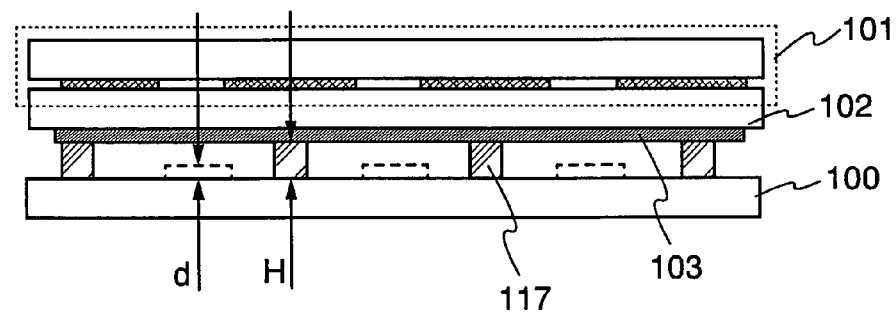

Here, with respect to the transfer method using a laser beam, the positional relationship between a light-transmitting substrate provided with a light absorbing layer and a substrate opposite to the light absorbing layer will be described with reference to FIGS. 4A to 4C. Note that FIGS. 4A to 4C are cross-sectional views illustrating the positional relationship between the substrate opposite to the light absorbing layer and a mask. Further, here, the structure shown in FIGS. 1A and 1B is used as a typical mode; however, the transfer method can be used for the structures shown in FIGS. 2A to 3B as appropriate.

As shown in FIG. 4A, a so-called contact method is used such that the surface of the substrate 100 and the light-transmitting substrate 102 to be provided with a light absorbing layer 103 are disposed with the light absorbing layer 103 therebetween. At that time, the substrate 100 and the light absorbing layer 103 may be in contact with each other. In this case, when the light absorbing layer is irradiated with a laser beam, since the distance through which part of the light absorbing layer is transferred is short, the part of the light absorbing layer can easily be transferred to the substrate; thus, throughput can be improved.

Further, as shown in FIG. 4B, a proximity method can be used such that the substrate 100 and the light-transmitting substrate 102 are disposed so as to sandwich a support member 116 such as a frame therebetween, which makes it possible to hold a certain gap between the substrate 100 and the light-transmitting substrate 102. Also in the case, the surface of the substrate 100 and the light-transmitting substrate 102 to be provided with the light absorbing layer 103 are disposed with the light absorbing layer 103 therebetween. In this case, a substrate and a light-transmitting substrate can be disposed without damaging the surface of the light absorbing layer 103, which improves yield.

Further, as shown in FIG. 4C, a spacer 117 may be provided between the light absorbing layer 103 and the substrate 100, and the spacer 117 may be disposed between the substrate 100 and the light-transmitting substrate 102. Note that the spacer 117 is sandwiched between the layer in contact with the light absorbing layer 103 and the substrate 100 in steps illustrated in FIGS. 2A to FIG. 3B. As the spacer 117, spherical spacers or columnar spacers can be used as appropriate.

A height H of that spacer 117 preferably has a thickness as 2.5 to 20 times as the thickness d of the layer 118 to be transferred to the substrate by irradiating the light absorbing layer 103 with a laser beam. If the height H of the spacer is larger than the range, it is difficult to keep uniformity of the layer 118 to be transferred.

As shown in FIG. 4C, a plurality of spacers 117 are provided over a substrate 100; thus, even in the case where a large substrate is used, the gap between the light-transmitting substrate 102 and the substrate 100 can be kept to be uniform.

Note that in FIGS. 4A to 4C, the substrate 100 and the mask 101 are disposed with the light-transmitting substrate 102 therebetween.

Alternatively, a mirror projection method or a stepper method can be used. In this case, a mask is provided between a light source and an optical system such as a mirror or a lens, and the light-transmitting substrate is provided so as to oppose the substrate, between the substrate and the optical system such as a mirror or a lens. When the mirror projection method or the stepper method is used, a layer can be transferred with a highly accurate shape and position.

Next, a mask which can be used in FIGS. 1A to 4C will be described below. The structure shown in FIGS. 1A and 1B is used below as a typical mode for the mask which can be used in FIGS. 1A to 4C; however, structures shown in FIGS. 2A and 2B or FIGS. 3A and 3B can be used as appropriate.

Figure 5A:
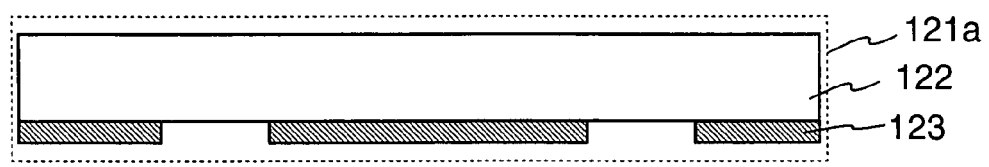
FIGS. 5A and 5B are cross-sectional views illustrating a mask applicable to the present invention.

As a mask which can be used in FIGS. 1A to 4C, a binary mask 121a as shown in FIG. 5A can be used. In a binary mask 121a, a light blocking layer 123 of chromium, chromium oxide, or the like which absorbs light is selectively formed on a light-transmitting substrate 122 of quartz or the like. A region in the light-transmitting substrate 122, where the light blocking layer 123 is not formed can transmit light.

Figure 5B:
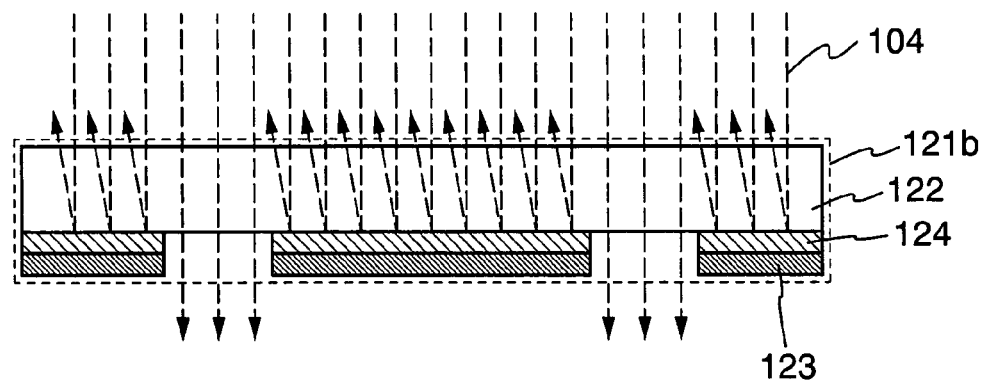

Further, when the energy of a laser beam with which the light absorbing layer is irradiated is high, a reflective layer 124 is preferably provided between the light-transmitting substrate 122 and the light blocking layer 123 as with a binary mask 121b shown in FIG. 5B. With the provision of the reflective layer 124, the amount of the laser beam which is absorbed in the light blocking layer can be reduced. Accordingly, conversion of energy into heat due to light absorption in the laser beam 104 and deformation of the pattern of the light blocking layer due to the heat can be prevented.

As the reflective layer 124, a dielectric mirror or a reflective layer can be used. The dielectric mirror is a laminate in which two kinds of transparent insulating layers having different refractive indices are stacked alternately. Here, as the refractive indices of the two kinds of transparent insulating layers are high, or as the number of the layers is large, the reflection efficiency is high. Note that the dielectric mirror may preferably formed of a material such that the layers can be stacked as appropriate in accordance with the wavelength of the laser beam to be applied. For example, the laminate of the dielectric mirror which reflects visible light may have a layered structure of titanium dioxide and silicon dioxide, a layered structure of zinc sulfide and magnesium fluoride, a layered structure of amorphous silicon and silicon nitride, or the like.

Further, as the reflective layer, a layer formed of aluminum, gold, silver, nickel, or the like may be used. Further, the dielectric mirror and the reflective layer may be stacked together.

Further, as a mask which can be used in FIGS. 1A to 4C, a phase shift mask can be used. When a phase shift mask is used, a layer having a fine shape, typically, a layer having a small width or a layer having a small width and small length can be formed.

First, a case of using a Levenson phase shift mask as the phase shift mask will be described. In a phase shift mask 131 shown in FIG. 6A, a plurality of fine depressions and projections are regularly formed over a substrate surface. The phase of the laser beam transmitted through the phase shift mask is modulated and partial extinction interference is generated due to the depressions and projections; thus, the phase of the cycle of intensity of a laser beam can be modulated. Here, depressions and projections are provided such that the phase difference between each of the depressions and projections that are adjacent is 180°. As a result, phases 132 in FIG. 6B has a difference of 180°. When the components of light are interfered, an intensity distribution 133 of the laser beam as shown in FIG. 6C is obtained.

Figure 6A:
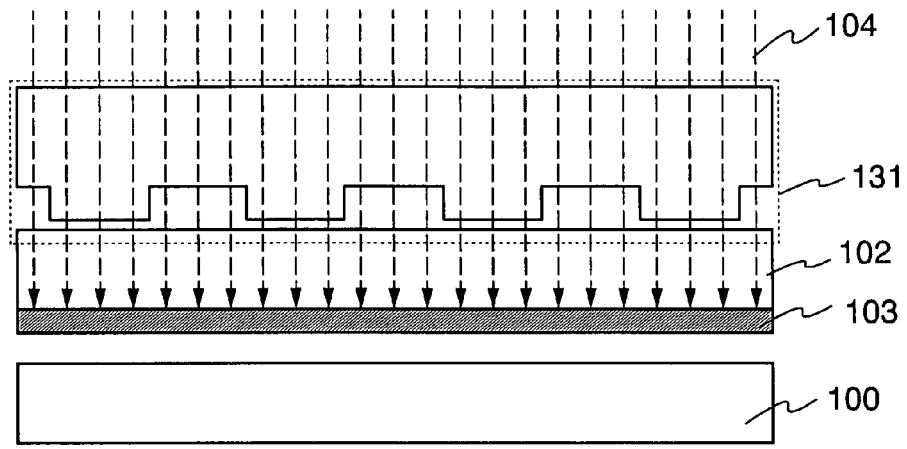
FIGS. 6A to 6D are cross-sectional views illustrating a method of manufacturing a semiconductor device of the present invention and a mask applicable to the invention.
Figure 6B:
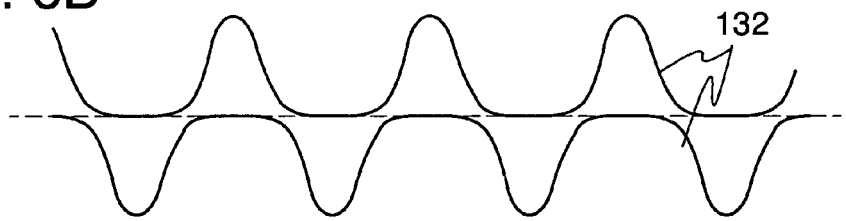
Figure 6C:

When the light absorbing layer 103 in FIG. 6A is irradiated with the laser beam shown in FIG. 6C, sufficient differences between regions which absorb a laser beam and regions which do not absorb a laser beam can be ensured in the light absorbing layer.

Figure 6D:
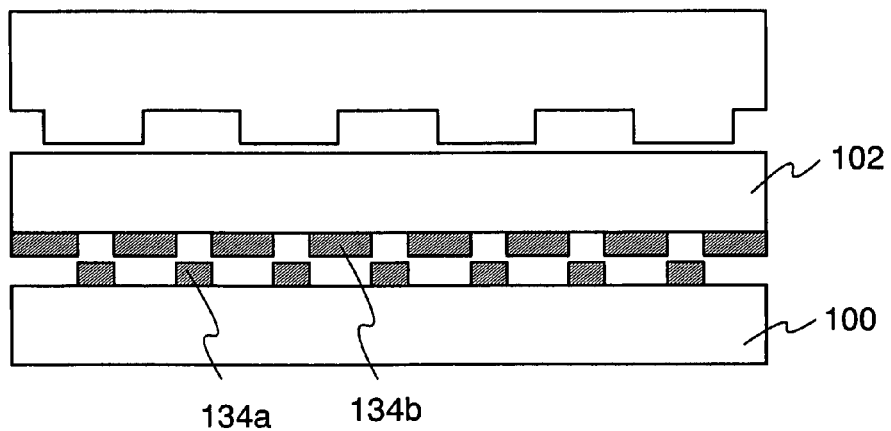

As a result, as shown in FIG. 6D, a layer 134a having a small width can be transferred to the substrate 100. Note that as shown in FIG. 6D, a remaining portion 134b of the light absorbing layer remains on the light-transmitting substrate 102.

Figure 7A:
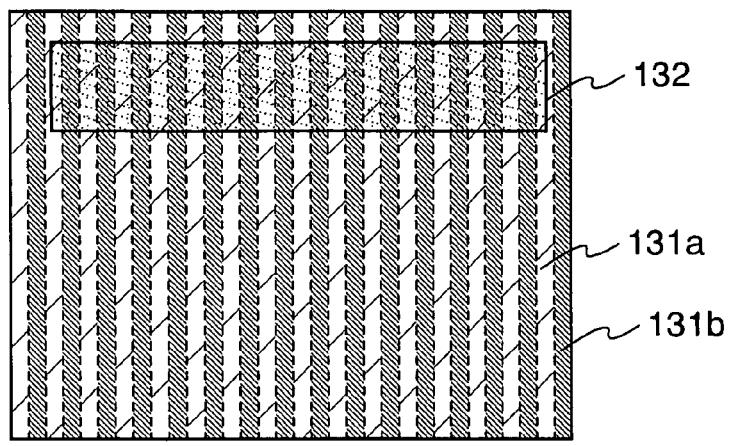
FIGS. 7A to 7C are top views illustrating a laser beam irradiation method.
Figure 7B:
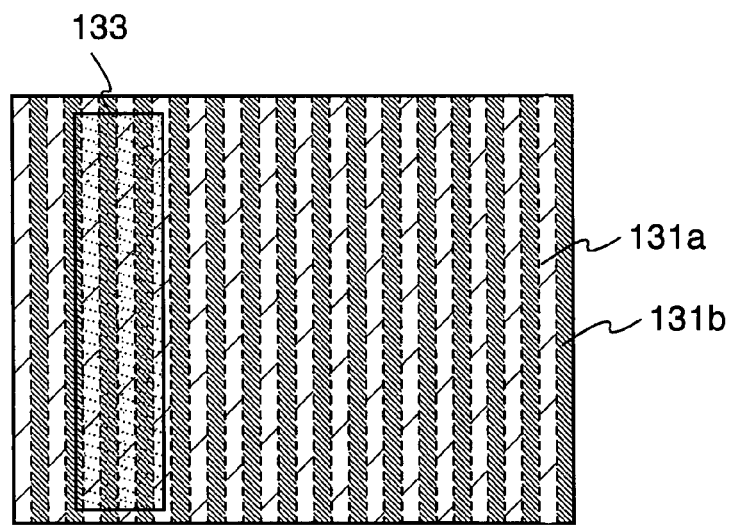
Figure 7C:
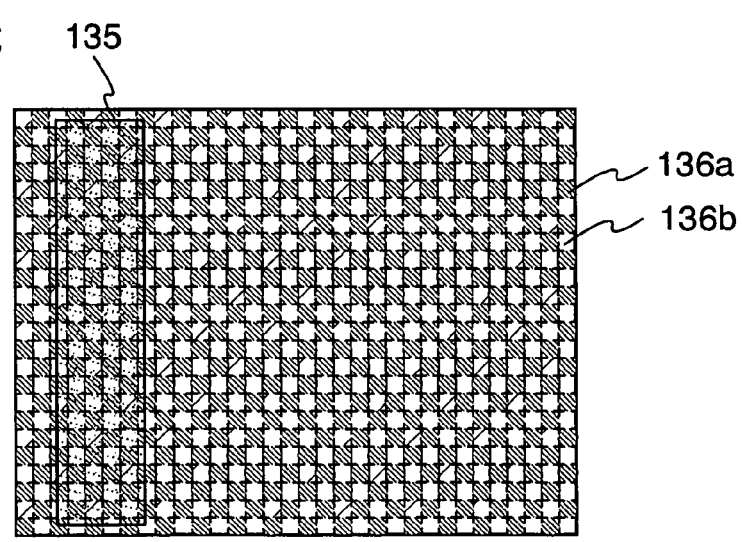

Here, the depressions and projections of the phase shift mask and the position of the beam spot of a laser beam will be described with reference to FIGS. 7A to 7C. FIGS. 7A to 7C are top views of phase shift masks.

As shown in FIG. 7A, a beam spot is disposed so that interfaces between projections 131a and depressions 131b in a phase shift mask are parallel to the width direction of the beam spot to scan a laser beam. Further, the scan direction of the laser beam is parallel to the interfaces between the projections 131a and depressions 131b. Note that the positions of the laser beam and the phase shift mask are fixed and the light-transmitting substrate and the substrate are moved in the direction parallel to the interface between the projections 131a and depressions 131b, thereby transferring the layer to the substrate.

Further, as shown in FIG. 7B, a beam spot is disposed so that the interfaces between the projections 131a and depressions 131b of the phase shift mask are parallel to the length direction of the beam spot to scan a laser beam. The scan direction of the laser beam is perpendicular to the interfaces between the projections 131a and depressions 131b. Note that the positions of the laser beam and the phase shift mask are fixed and the light-transmitting substrate and the substrate are moved in the direction perpendicular to the interface between the projections 131a and depressions 131b, thereby transferring the layer to the substrate.

Moreover, as shown in FIG. 7C, the depressions and the projections of the phase shift mask may have a grid pattern. That is, projections 136a may be arranged on diagonal lines, and depressions 136b may be disposed so as to fill the spaces therebetween. In such a case, the intensity of the laser beam as shown in FIG. 6C is formed two-dimensionally.

Next, a mode of selectively transferring a layer onto a substrate using a phase shift mask and a binary mask will be described with reference to FIGS. 8A to 8E.

Figure 8A:
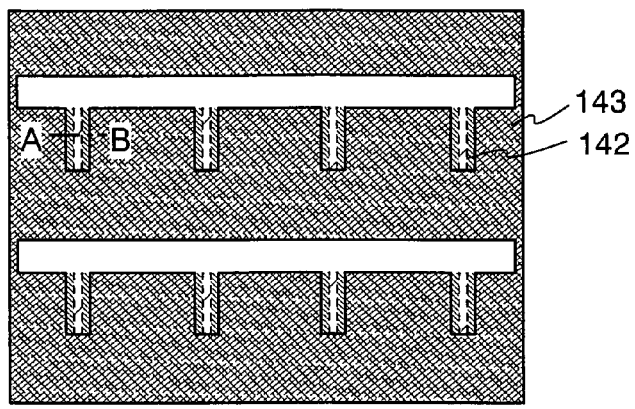
FIGS. 8A to 8E are a top view and cross-sectional views which illustrate a method for a method of manufacturing a semiconductor device of the present invention and a mask applicable to the invention.
Figure 8B:
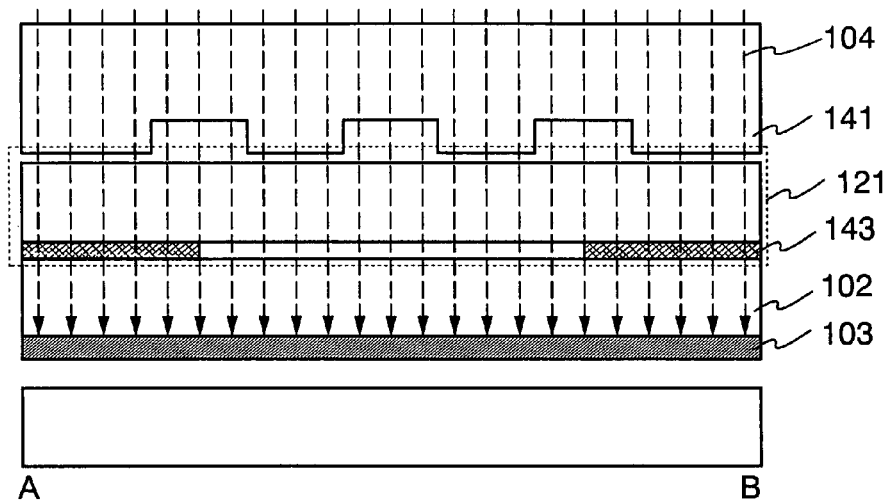

FIG. 8A is a top view of one mode of a mask for forming a gate wiring and a gate electrode. A binary mask 121 provided with a light blocking layer 143 having an opening in a region where a gate wiring and a gate electrode will be formed, and a phase shift mask 141 are overlapped at a formation region of the gate electrode. FIG. 8B shows a cross-sectional view taken along line A-B in FIG. 8A.

As shown in FIG. 8B, in a region where the gate electrode is to be formed, depressions and projections are formed in the phase shift mask 141. Further, a region where the gate wiring and gate electrode are not formed is not irradiated with a laser beam; thus, the light blocking layer 143 is formed on the binary mask 121. Note that as the binary mask 121, the binary masks 121a and 121b shown in FIGS. 5A and 5B can be used as appropriate. Further, the light blocking layer 143 can be formed of the same material as the light blocking layer 123 or the reflective layer 124 shown in FIG. 5B.

Figure 8C:
Figure 8D:
Figure 8E:
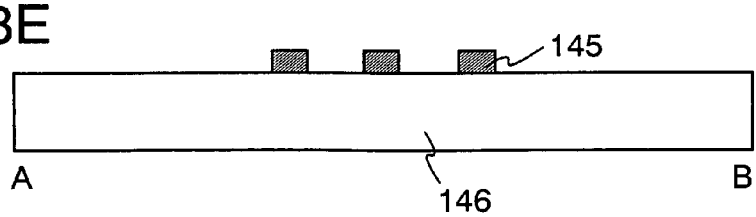

A laser beam transmitted through the phase shift mask 141 has phases 144 with a difference of 180° as shown in FIG. 8C. When the components of light are interfered, an intensity 145 of the laser beam is obtained as shown in FIG. 8D. That is, when the light absorbing layer 103 is irradiated with the laser beam shown in FIG. 8D, sufficient differences between regions which absorb a laser beam and regions which do not absorb a laser beam can be ensured in the light absorbing layer in a region where the gate electrode is formed. Further, a wiring region can be irradiated with a laser beam.

As a result, a gate wiring having a large width and a gate electrode 146 having a small width can be formed at the same time. Accordingly, a laser beam is applied with the binary mask and the phase shift mask stacked together; thus, a layer having a predetermined width can be selectively formed in a desired region.

Here, the binary mask 121 and the phase shift mask 141 are stacked and the light absorbing layer is irradiated with a laser beam; alternatively, the light blocking layer 143 may be provided on the phase shift mask 141. In that case, the alignment accuracy of the binary mask 121 and the phase shift mask 141 can be increased; thus, yield can be improved.

Further, as the phase shift mask, a phase shift mask in which the shapes of the top faces of the depressions or projections are circular can be used.

Figure 9A:
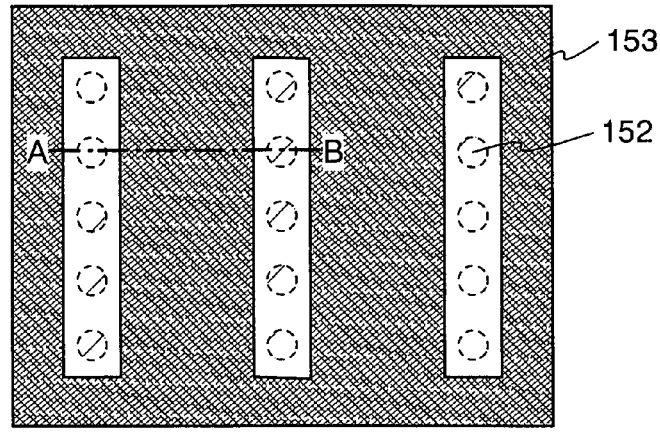
FIGS. 9A to 9C are a top view and cross-sectional views which illustrate a method for a method of manufacturing a semiconductor device of the present invention and a mask applicable to the invention.
Figure 9B:
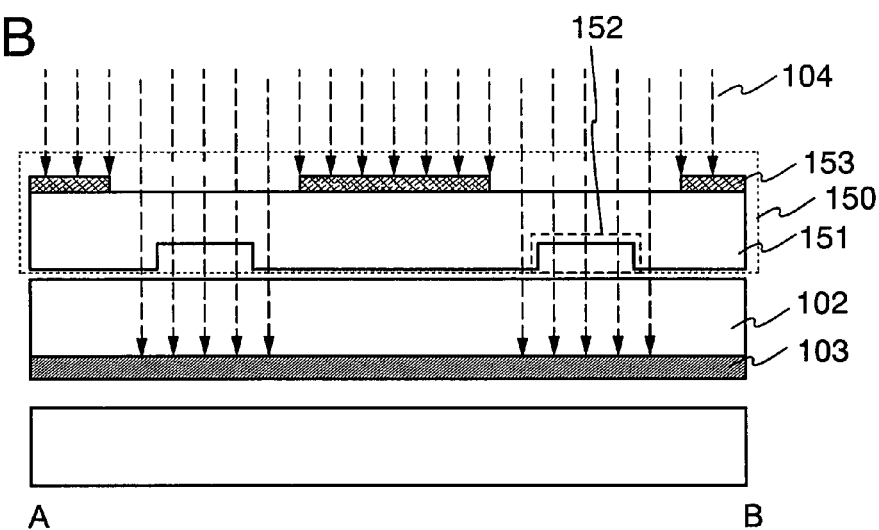
Figure 9C:
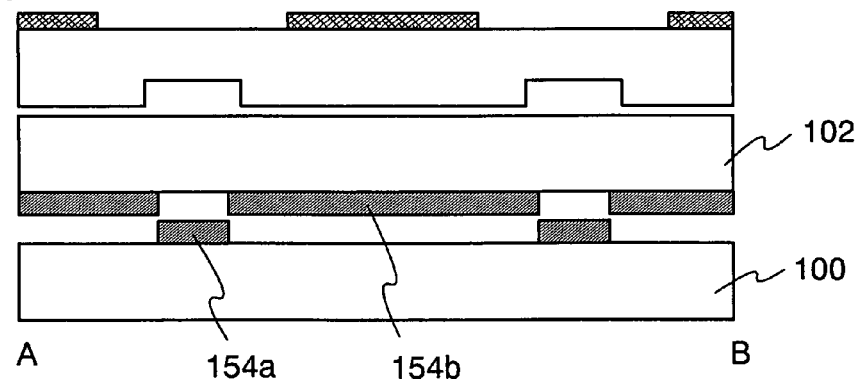

FIG. 9A is a top view of a phase shift mask in which the shapes of the top faces of the depressions or projections are circular. Here, an example of forming depressions 152 having circular top faces on the substrate will be described. Further, in a region which is not required to be irradiated with a laser beam, a light blocking layer 153 is provided. FIGS. 9B and 9C each show a cross-section taken along line A-B in FIG. 9A.

As shown in FIG. 9B, the light absorbing layer 103 is irradiated with a laser beam 104 through a phase shift mask 150 and the light-transmitting substrate 102. Part of the laser beam 104 is blocked by the light blocking layer 153. Further, since the phases of light in the depressions 152 and projections are shifted by 180°; thus, sufficient intensity difference of light can be ensured. Note that the light blocking layer 153 can be formed of the same material as the light blocking layer 123 or the reflective layer 124 shown in FIG. 5B.

Thus, as shown in FIG. 9C, a layer 154a having a circular top face can be transferred to the substrate 100. Note that as shown in FIG. 9C, a remaining portion 154b of the light absorbing layer 103 remains on the light-transmitting substrate 102.

Note that FIGS. 6A to 9C illustrate modes of forming a phase difference in a laser beam by forming depressions and projections on the surface of the light-transmitting substrate; alternatively, a phase shift mask which forms a phase difference in a laser beam using a light blocking layer and a phase shifter material.

Next, a halftone phase shift mask will be described as a phase shift mask.

Figure 10A:
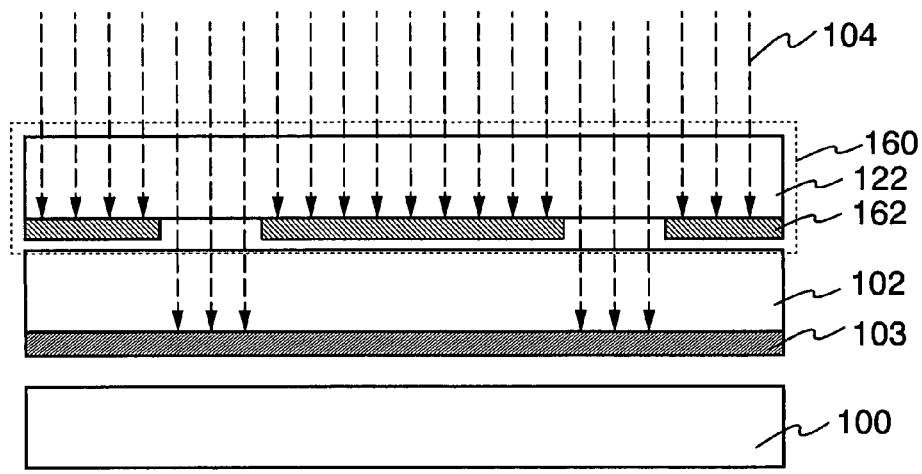
FIGS. 10A to 10D are cross-sectional views illustrating a method for a method of manufacturing a semiconductor device of the present invention and a mask applicable to the invention.
Figure 10B:

In a halftone phase shift mask 160, as shown in FIG. 10A, instead of the light blocking layer, a translucent phase shifter material 162 is selectively formed on the light-transmitting substrate 122 of quartz or the like. In the amplitude distribution 163 of a laser beam here, light transmitted through the phase shifter material 162 and light transmitted through a region without the phase shifter material 162 has an inverted amplitude-distribution as shown in FIG. 10B.

Figure 10C:

As a result, as shown in FIG. 10C, the intensity distribution 164 of the laser beam sharply increases at an interface of the phase shifter material 162.

The light absorbing layer 103 is irradiated with a laser beam having an intensity distribution FIG. 10C; thus, sufficient differences of regions which absorb a laser beam and regions which does not absorb a laser beam can be ensured in the light absorbing layer in a region where the gate electrode is formed.

Figure 10D:
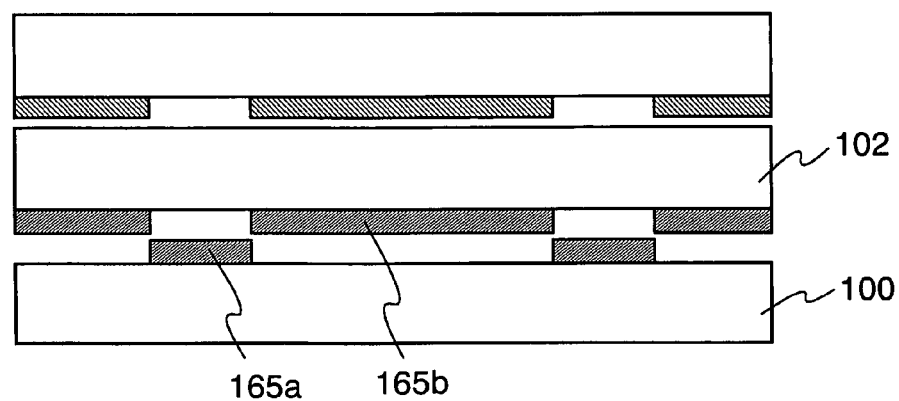

As a result, as shown in FIG. 10D, a layer 165a having a small width can be transferred to the substrate 100. Note that as shown in FIG. 10D, a remaining portion 165b of the light absorbing layer remains on the light-transmitting substrate 102.

Further, as a mask which can be used in FIGS. 1A to 4C, a mask having a microlens, a microlens array, or the like, which at least has curvature at the top portion, preferably, a microlens which has semispherical shape as a convex lens or a concave lens as a whole microlens can be used. Note that a microlens can focus a laser beam on a light absorbing layer when it is convex or concave toward the side to be irradiated with the laser beam. A mask having a microlens array will be described with reference to FIGS. 11A and 11B.

A microlens array is formed on a surface of a mask 171. Further, in a region which is not required to be irradiated with a laser beam, a light blocking layer 173 is provided. Note that the light blocking layer 173 can be formed of the same material as the reflective layer 124 as shown in FIG. 5B.

Figure 11A:
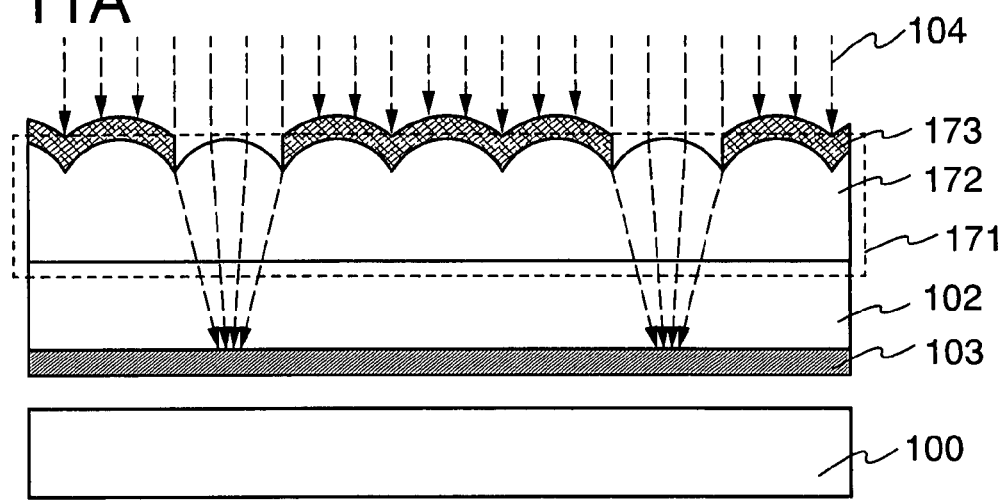
FIGS. 11A and 11B are cross-sectional views illustrating a method for a method of manufacturing a semiconductor device of the present invention and a mask applicable to the invention.

As shown in FIG. 11A, the light absorbing layer 103 is irradiated with a laser beam 104 through the mask 171 and the light-transmitting substrate 102. Part of the laser beam 104 is blocked by the light blocking layer 173. Further, light is focused through each leans of the microlens array. Accordingly, the light absorbing layer 103 is selectively irradiated with the focused laser beam 104.

Figure 11B:
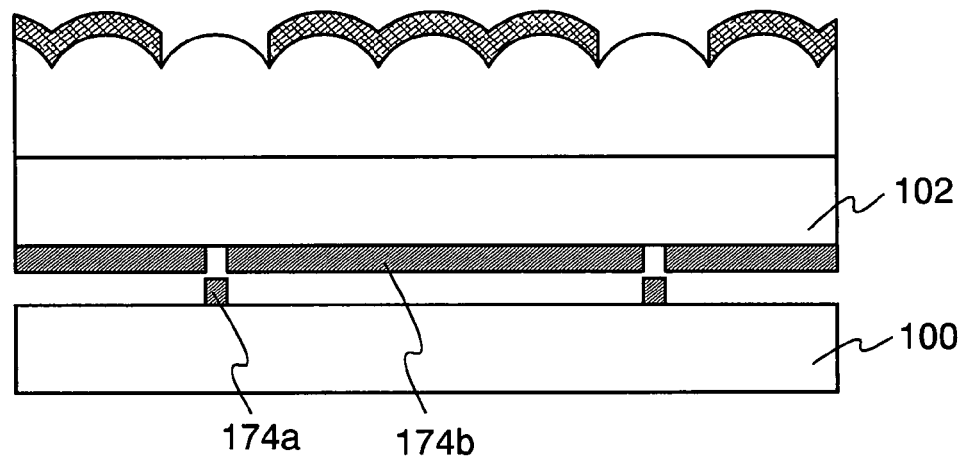

As a result, as shown in FIG. 11B, a layer 174a having a fine shape can be transferred to the substrate 100. Note that in FIG. 11C, a remaining portion 174b of the light absorbing layer 103 remains on the light-transmitting substrate 102.

Note that instead of a microlens array, a transparent composition may be discharged on a light-transmitting substrate and baked to form a microlens. Such a microlens can be formed of polyimide, acrylic, acetic acid vinyl resin, polyvinyl acetal, polystyrene, an AS resin, a methacrylic resin, polypropylene, polycarbonate, celluloid, acetate plastics, polyethylene, a methylpentene resin, a polyvinyl chloride resin, polyester resin, or a urea resin. Further, the microlens can be formed from $SiO_2$ containing a Si—$CH_3$ coupling typified by PSG (phosphorus glass), BPSG (phosphorus boron glass), silicate-based SOG (Spin on Glass), polysilazane-based SOG, alkoxysilicate-based SOG, polymethyl siloxane, or the like.

Using a transfer method using a laser beam, as described in this embodiment mode, a conductive layer, a semiconductor layer, and an insulating layer can be selectively formed over a substrate. Further, the transfer method can also be used for repairing steps for repairing a defect of a wiring. In particular, when a phase shift mask or a mask having a microlens is used as a mask, a defect of wiring in a region where the space between wirings is narrow can be repaired. Consequently, yield of a semiconductor device can be improved, and mass productivity can be increased.

Embodiment Mode 2

In this embodiment mode, a method of manufacturing a semiconductor element using Embodiment Mode 1 will be described with reference to FIGS. 12A to 12F.

Here, as the semiconductor element, an inverted staggered thin film transistor 188 will be described. Note that a semiconductor element such as a staggered thin film transistor, a coplanar thin film transistor, a diode, a MOS transistor, or the like can be manufactured without limitation to an inverted staggered thin film transistor.

Figure 12A:
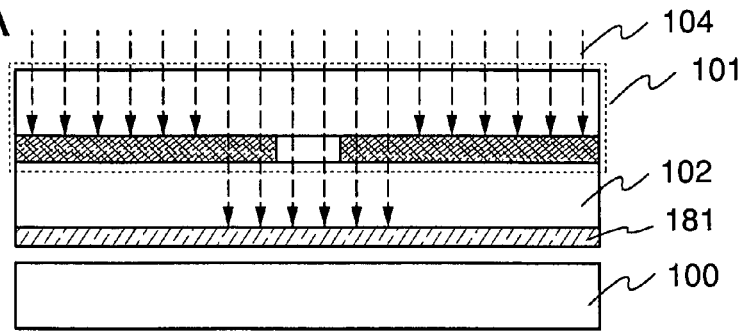
FIGS. 12A to 12F are cross-sectional views illustrating a method of manufacturing a semiconductor device of the present invention.

As shown in FIG. 12A, a light absorbing layer 181 is formed over one face of a light-transmitting substrate 102. Here, as the light absorbing layer 181, a tungsten layer is formed to a thickness of 10 nm to 1000 nm or more over the light-transmitting substrate 102 by sputtering. Further, a substrate 100 is provided so as to oppose the light absorbing layer 181. A mask 101 is provided on the other face side of the light-transmitting substrate. Note that the one face and the other face of the light-transmitting substrate 102 are opposite to each other.

Figure 12B:
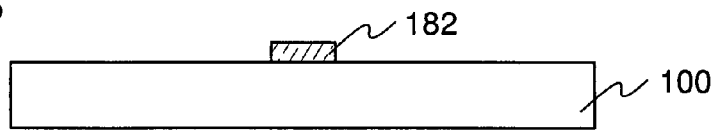

Next, the light absorbing layer 181 is irradiated with a laser beam 104 through a mask 101 and a light-transmitting substrate 102. As a result, as shown in FIG. 12B, part of the light absorbing layer 181, which has been irradiated with the laser beam, is transferred onto the substrate 100. Here, the transferred light absorbing layer is referred to as a layer 182. The layer 182 serves as a gate electrode.

Note that the layer 182 which serves as a gate electrode may be formed by a droplet discharge method by which a layer having a predetermined shape is formed by discharging droplets of a composition adjusted from minute openings. Alternatively, a printing method may be used to form the layer 182. Further, after forming a conductive layer over a substrate by a CVD method, a PVD method, a coating method, or the like and then, the conductive layer may be selectively etched by a photolithography process thereby forming the layer 182.

Figure 12C:
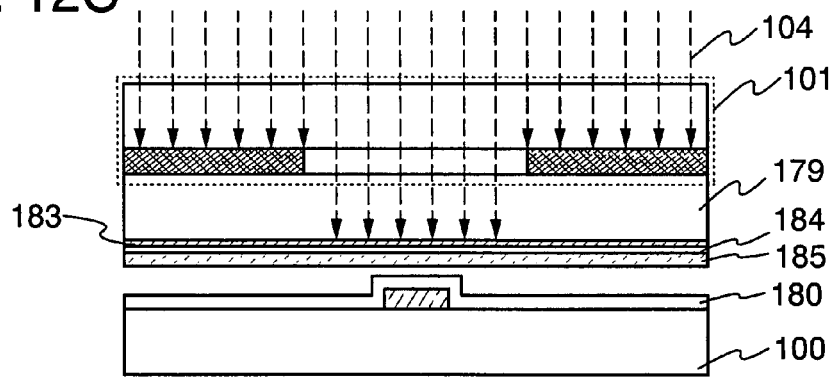

Next, as shown in FIG. 12C, a gate insulating layer 180 is formed over the substrate 100 and the layer 182. Here, a silicon nitride layer is formed to a thickness of 50 nm to 200 nm by plasma CVD.

Next, a light absorbing layer 183, an insulating layer 184, and a semiconductor layer 185 are formed over a light-transmitting substrate 179. Here, a zinc oxide layer with a thickness of 10 nm to 50 nm is formed as the light absorbing layer 183, a silicon oxynitride layer with a thickness of 10 nm to 50 nm as the insulating layer 184, and an amorphous silicon layer with a thickness of 10 nm to 50 nm as the semiconductor layer 185 are formed by plasma CVD.

Next, the gate insulating layer 180 over the substrate 100 and the semiconductor layer 185 over the light-transmitting substrate 179 are provided so as to oppose each other, and after providing a mask 101 over the light-transmitting substrate 179, the light absorbing layer 183 is irradiated with the laser beam 104 through the mask 101 and the light-transmitting substrate 179.

Note that at that time, the light absorbing layer 183 may be irradiated with the laser beam 104 under reduced pressure. Further, the light absorbing layer 183 may be irradiated with the laser beam 104 while heating the substrate 100.

Figure 12D:
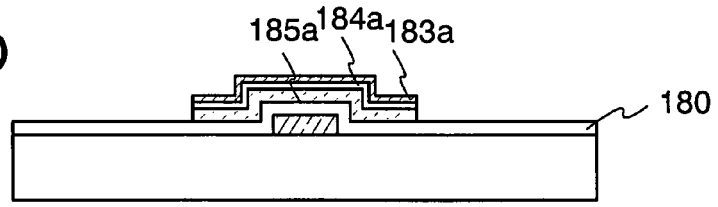

As a result, as shown in FIG. 12D, a semiconductor layer 185a, an insulating layer 184a, and a light absorbing layer 183a are formed over the gate insulating layer 180 over the substrate 100. After that, the light absorbing layer 183a and the insulating layer 184a over the semiconductor layer 185a are removed. Note that here, the insulating layer 184a serves as a blocking layer for preventing the light absorbing layer 183a from mixing into the semiconductor layer 185a. Further, the insulating layer 184a also serves as an etching stopper layer used at a time of etching the light absorbing layer 183a. Accordingly, the insulating layer 184a is provided so as to be in contact with the light absorbing layer 183. Thus, impurities can be prevented from mixing into the semiconductor layer when the semiconductor 185a by transfer method, and the uniformity of the film thickness of the semiconductor layer 185a can be increased.

After the insulating layer 184a and the light absorbing layer 183a are removed, the semiconductor layer 185a may be irradiated with a laser beam. Further, the semiconductor layer 185a can be heated. As a result, a crystalline semiconductor layer or a microcrystalline semiconductor layer can be formed.

Note that the semiconductor layer 185a may be formed by a droplet discharge method by which a layer having a predetermined shape is formed by discharging droplets of a composition adjusted from minute openings. Alternatively, a printing method may be used to form the semiconductor layer 185a. Further, after forming a semiconductor layer over a substrate by a CVD method, a PVD method, a coating method, or the like and then, the conductive layer may be selectively etched by a photolithography process thereby forming the semiconductor layer 185a.

Figure 12E:
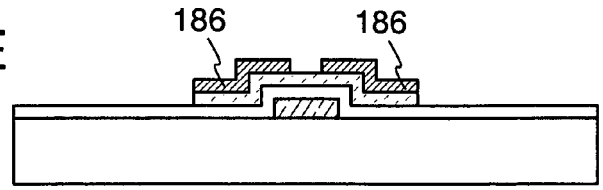

Next, as shown in FIG. 12E, a contact layer 186 is formed over the semiconductor layer 185a. Here, an amorphous silicon layer doped phosphorus is formed as the contact layer 186 by a method similar to the layer 182. Further, contact layer 186 may be formed by a droplet discharge method by which a layer having a predetermined shape is formed by discharging droplets of a composition adjusted from minute openings. Alternatively, a printing method may be used to form the contact layer 186. Further, after forming a layer over a substrate by a CVD method, a PVD method, a coating method, or the like and then, the layer may be selectively etched by a photolithography process thereby forming the contact layer 186.

Figure 12F:
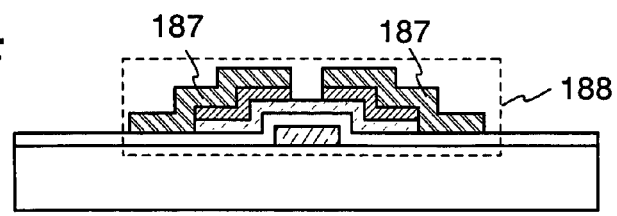

Next, as shown in FIG. 12F, a wiring 187 is formed over the contact layer 186. The wiring 187 can be formed by a method similar to the layer 182. Further, the wiring 187 may be formed by dropping a conductive paste by a droplet discharge method and baking it. Here, an aluminum layer is formed by a method similar to the layer 182. Further, the wiring 187 may be formed by a droplet discharge method by which a layer having a predetermined shape is formed by discharging droplets of a composition adjusted from minute openings. Alternatively, a printing method may be used to form the wiring 187. Further, after forming a conductive layer over a substrate by a CVD method, a PVD method, a coating method, or the like and then, the conductive layer may be selectively etched by a photolithography process thereby forming the wiring 187.

Moreover, as shown in FIGS. 12E and 12F, the contact layer 186 and the wiring 187 may be transferred simultaneously as with the layer 182 without forming the contact layer 186 and wiring 187 in different steps.

Note that a method by which a layer having a predetermined shape is formed by discharging droplets of a composition adjusted from minute openings is referred to as a droplet discharge method.

Through the above steps, a semiconductor element can be manufactured using a transfer method using a laser beam.

Embodiment Mode 3

In this embodiment mode, a method for forming a contact hole through a more simplified process with high reliability at low cost will be described with reference to FIGS. 13A to 14D.

When conductive layers are electrically connected to each other with an insulating layer interposed therebetween, an opening (so-called contact hole) is formed in the insulating layer. In this case, a mask layer is not formed over the insulating layer, and the opening is selectively formed by laser beam irradiation. A first conductive layer is formed, an insulating layer is stacked over the first conductive layer, and a region where the opening is formed in the stacked first conductive layer and insulating layer is selectively irradiated with a laser beam from the insulating layer side. When the first conductive layer is formed of a conductive material which absorbs a laser beam, the laser beam is transmitted through the insulating layer and absorbed by the first conductive layer. The first conductive layer is heated by energy of the absorbed laser beam and evaporated, and the insulating layer that is stacked thereover is broken. Therefore, the opening is formed in the first conductive layer and the insulating layer, and part of the conductive layer below the insulating layer is exposed on the side wall and the bottom (or only on the side wall) of the opening. By formation of a second conductive layer in the opening so as to be in contact with the exposed first conductive layer, the first and second conductive layers can be electrically connected to each other with the insulating layer interposed therebetween. In other words, in the present invention, the conductive layer is irradiated with a laser beam, an irradiated region of the conductive layer with a laser beam is evaporated by laser ablation, and the opening is formed in the insulating layer that is formed over the conductive layer.

The above method for forming a contact hole will be specifically described with reference to FIGS. 13A to 13D. In this embodiment mode, as shown in FIGS. 4A to 4D, a conductive layer 721a, a conductive layer 721b which absorbs a laser beam, and an insulating layer 722 are formed over a substrate 720.

The conductive layer 721a and the conductive layer 721b which absorbs a laser beam are formed to have a layered structure. In this embodiment mode, low-melting point metal (chromium in this embodiment mode) that is relatively easily evaporated is used for the conductive layer 721b which absorbs a laser beam, and a metal having a higher melting point (tungsten in this embodiment mode) compared to the conductive layer 721b which absorbs a laser beam is used for the conductive layer 721a.

Figure 13A:
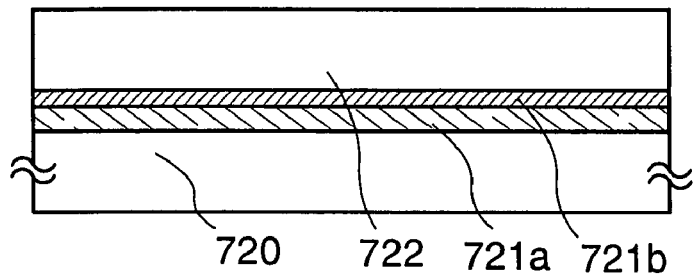
FIGS. 13A to 13D are cross-sectional views illustrating a method of manufacturing a semiconductor device of the present invention.
Figure 13B:
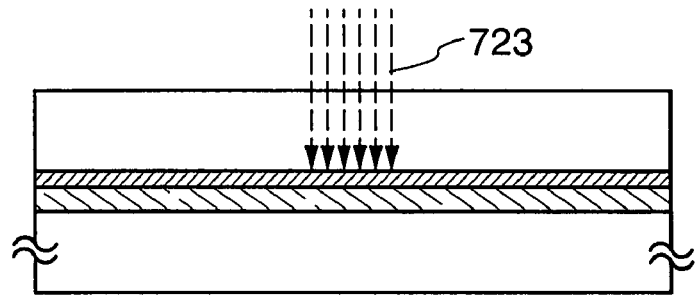

As shown in FIG. 13B, the conductive layer 721b which absorbs a laser beam is selectively irradiated with a laser beam 723 from the insulating layer 722 side. The region of the conductive layer 721b, which is irradiated with the laser beam is evaporated due to the energy of the laser beam. Thus, the insulating layer 722 over the irradiated region of the conductive layer 721b which absorbs a laser beam is removed, and an opening 725 can be formed. The conductive layer 721b which absorbs a laser beam is separated into conductive layers 728a and 728b, and the insulating layer 722 is separated into insulating layers 727a and 727b (see FIG. 13C). A conductive layer 726 is formed in the opening 725; therefore, the conductive layer 721a, the conductive layers 728a and 728b, and the conductive layer 726 can be electrically connected (see FIG. 4D).

Figure 13C:
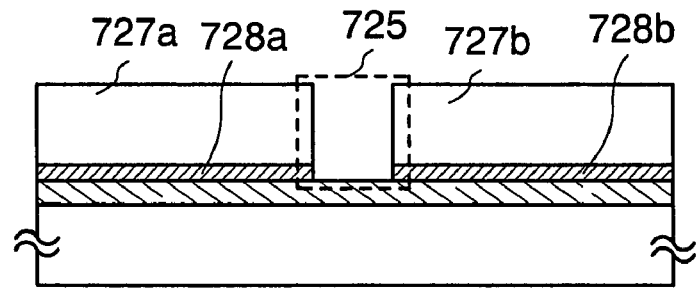
Figure 13D:
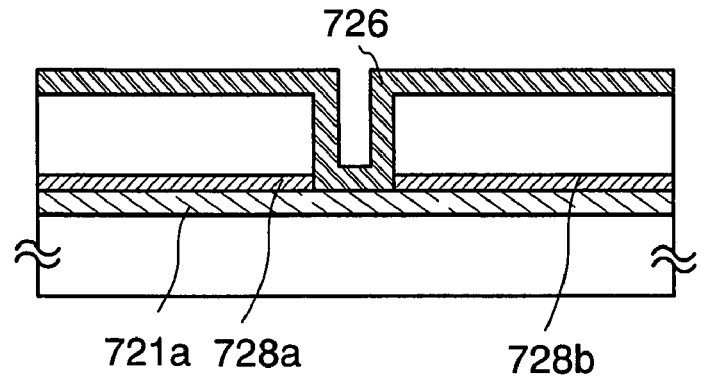

Further, as shown in FIG. 13C, after an opening 725 is formed, in the case where an oxide layer is formed on the surface of the conductive layer 721a, the oxide layer is preferably removed. As a method for removing the oxide layer, wet etching, dry etching, or the like can be used as appropriate. Note that when the conductive layer 721a is a tungsten layer, the oxide layer is preferably removed by dry etching because wet etching using a solution of hydrofluoric acid or the like embrittles the conductive layer 721a.

The beam spot shape of the laser beam 723 may have a pointed, planar, linear, rectangular shape, or the like as appropriate. One point may be irradiated with the laser beam having the above shape to form the opening 725. Further, a laser beam having the above shape may be scanned one-dimensionally or two-dimensionally to selectively form the opening 725. A laser beam emitted from the laser oscillator mentioned in Embodiment Mode 1 may be used for the laser beam 723 as appropriate.

The conductive layers 721a and 721b can be formed by an evaporation method, a sputtering method, a PVD (Physical Vapor Deposition) method, a CVD method such as a low-pressure CVD (LPCVD) method or a plasma CVD method, or the like. In addition, a method by which a component can be formed into a desired pattern by transferring or drawing, for example, various printing methods (a method for forming a component into an appropriate pattern, such as screen (mimeograph) printing, offset (planograph) printing, relief printing, gravure (intaglio) printing, and the like), a dispenser method, a selective-coating method, or the like can also be used. As the conductive layers 721a and 721b, one or a plurality of chromium, molybdenum, nickel, titanium, cobalt, copper, and aluminum can be used.

In FIGS. 13A to 13D, an example is shown, in which the conductive layer 721b which absorbs a laser beam is evaporated by irradiation with the laser beam 723, the opening 725 is formed in the insulating layer 722, and the stacked conductive layer 721a remains. FIGS. 14A to 14D show other examples in which an opening is formed to reach a conductive layer formed below an insulating layer.

FIG. 5A shows an example in which an upper conductive layer of conductive layers which are stacked below an insulating layer is a conductive layer which absorbs a laser beam and only an upper portion of the conductive layer which absorbs a laser beam is removed by laser ablation. A conductive layer 731, a conductive layer 732 which absorbs a laser beam, and an insulating layer 733 are provided over a substrate 730, and a conductive layer 734 is provided in an opening 750 formed in the conductive layer 732 and the insulating layer 733. In the opening 750, the conductive layer 732 which absorbs a laser beam is exposed and electrically connected to and in contact with the conductive layer 734.

Figure 14A:
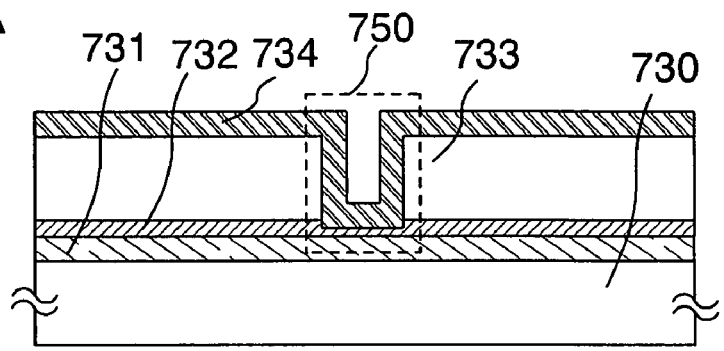
FIGS. 14A to 14D are cross-sectional views illustrating a method of manufacturing a semiconductor device of the present invention.
Figure 14B:
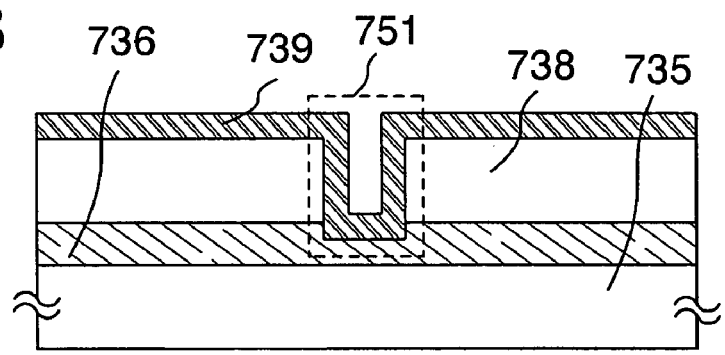
Figure 14C:
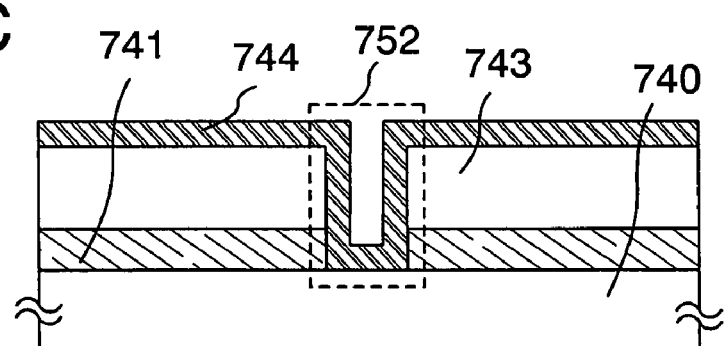

The conductive layer formed below the insulating layer may be a stacked layer including a plurality of kinds of conductive layers with different melting points, or of course, may be a single layer. FIGS. 14B and 14C show examples in which a conductive layer formed below an insulating layer, which absorbs a laser beam, is a single layer. FIG. 14B is an example in which only an upper portion of a conductive layer which absorbs a laser beam is removed by laser ablation. FIG. 14C is an example in which a conductive layer which absorbs a laser beam in a portion is removed by laser ablation until a substrate 740 is exposed.

In FIG. 5B, a conductive layer 736 and an insulating layer 738 are provided over a substrate 735 which absorbs a laser beam, and a conductive layer 739 is provided in an opening 751 formed in the conductive layer 736 which absorbs a laser beam and the insulating layer 738. In the opening 751, the conductive layer 736 is exposed and is electrically connected to and in contact with the conductive layer 739. As shown in FIG. 14B, when only the upper portion of the conductive layer is partially removed in a thickness direction, laser beam irradiation conditions (such as energy or irradiation time) may be controlled, or the conductive layer 736 may be formed thickly.

In FIG. 14C, a conductive layer 741 which absorbs a laser beam, and an insulating layer 743 are provided over a substrate 740, and a conductive layer 744 is provided in an opening 752 formed in part of the conductive layer 741 which absorbs a laser beam and the insulating layer 743. In the opening 752, the conductive layer 741 which absorbs a laser beam is exposed and electrically connected to and in contact with the conductive layer 744. It is not always necessary that the upper conductive layer and the lower conductive layer are in contact with each other at the bottom of the opening as shown in FIG. 14B, and a structure in which the upper conductive layer is formed to be in contact with and electrically connected to the lower conductive layer exposed on the side surface of the opening may be employed.

Figure 14D:
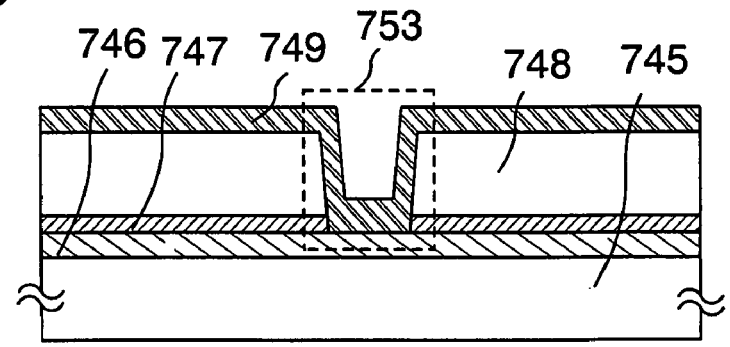

Further, as for the shape of the opening functioning as a contact hole, the side surface does not need to be perpendicular to the bottom surface, and the side surface of the opening may be tapered as shown in FIG. 14D. In FIG. 14D, a conductive layer 746 and a conductive layer 747 which absorbs a laser beam, and an insulating layer 748 are formed over a substrate 745, and an opening 753 is formed in the insulating layer 748 and the conductive layer 747. The opening 753 has a mortar shape and the side surface of the opening 753 is tapered with respect to the bottom surface.

As described above, in the opening provided in the insulating layer, the lower conductive layer below the insulating layer and the upper conductive layer over the insulating layer are electrically connected to each other. In this embodiment mode, a second conductive layer which absorbs a laser beam is formed of a laser film over a first conductive layer, and the second conductive layer is evaporated by a laser beam, whereby an opening is formed in an insulating layer formed over the first and second conductive layers. The size and shape of the opening formed in the insulating layer and the conductive layer can be controlled by laser beam irradiation conditions (such as laser intensity and irradiation time) and characteristics of materials for the insulating layer and the conductive layer (such as thermal conductivity, melting point, and boiling point).

Embodiment 1

In this embodiment, a method of manufacturing a semiconductor device having a conductive layer connected to a thin film transistor will be described with reference to FIGS. 15A to 15D. Here, a liquid crystal display panel is formed as a semiconductor device. Further, FIGS. 15A to 15D each show a cross-sectional view of one pixel of the liquid crystal display panel, which will be described below.

Figure 15A:
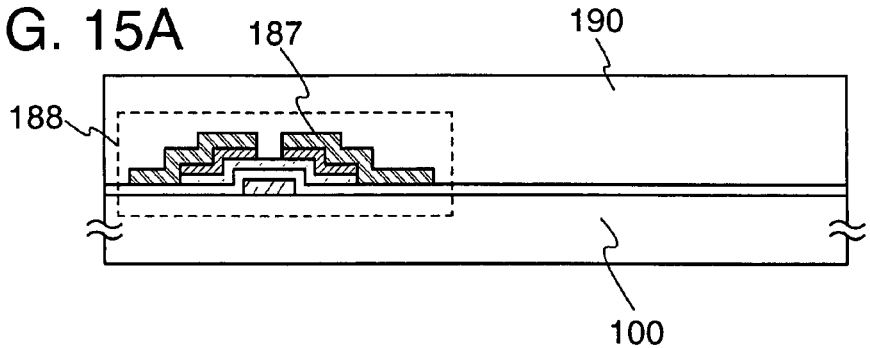
FIGS. 15A to 15D are cross-sectional views illustrating a method of manufacturing a semiconductor device of the present invention.

As shown in FIG. 15A, the thin film transistor 188 shown in Embodiment Mode 2 and an insulating layer 190 covering the thin film transistor 188 are formed over the substrate 100. Here, a composition is applied by a coating method, baked to form the insulating layer 190 formed of polyimide.

Next, part of the insulating layer 190 is removed by a method described in Embodiment Mode 3 to provide an opening, thereby forming the insulating layer 191 having the opening. After that, an oxide formed on a surface of the wiring 187 may be removed.

Figure 15B:
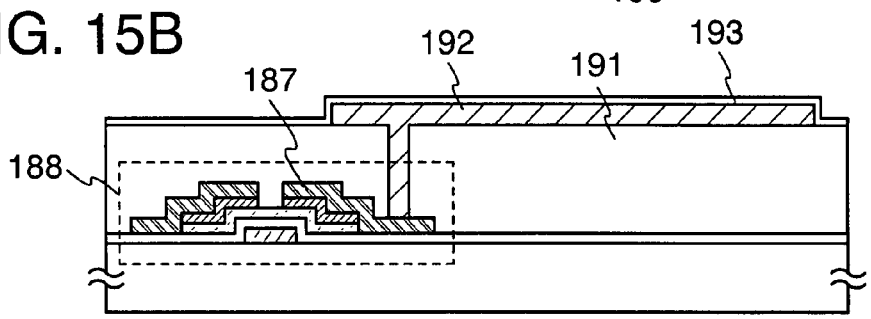

Next, as shown in FIG. 15B, a conductive layer 192 connected to the wiring 187 is formed in the opening and the surface of the insulating layer 191. Note that the conductive layer 192 serves as a pixel electrode. Here, the conductive layer 192 is formed using zinc oxide by a method shown in Embodiment Mode 1. When a light-transmitting conductive layer 192 is formed as the pixel electrode, a transmissive liquid crystal display panel can be manufactured later. Further, when a reflective conductive layer of Ag (silver), Au (gold), Cu (copper), W (tungsten), Al (aluminum), or the like is formed as the conductive layer 192, a reflective liquid crystal display panel can be manufactured later. In addition, when a light-transmitting conductive layer and a reflective conductive layer are formed in each pixel, a transflective liquid crystal display panel can be manufactured.

Note that as shown in FIG. 15B, the opening can be formed so that the wiring 187 and the conductive layer 192 are in contact with each other on the surface of the wiring.

Figure 15C:
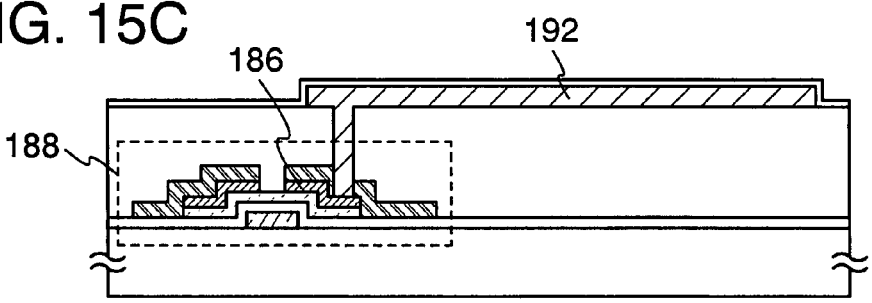
Figure 15D:
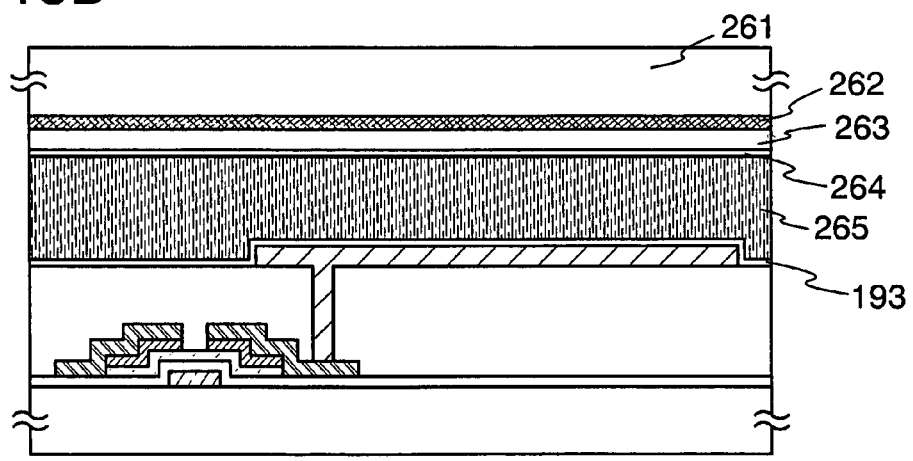

Further, as shown in FIG. 15C, the opening can be formed so that wiring 187 and the conductive layer 192 are in contact with each other on the surface of the contact layer 186.

Through the above steps, an active matrix substrate can be formed.

Next, an insulating film is formed by the printing method or spin coat method, and an alignment film 193 is formed by a rubbing treatment. It is to be noted that the alignment film 193 can be formed by oblique evaporation.

A sealing material (not shown) having a closed loop shape is formed by the droplet discharging method on the peripheral region of the pixel area in an counter substrate 261 provided with an alignment film 264, a second electrode (counter electrode) 263, and a colored layer 262. The sealing material may be mixed with filler, and the counter substrate 261 may be provided with a color filter and a shielding film (black matrix).

Next, a liquid crystal material is dropped to the inside of the closed loop made of the sealing material by dispensing method (dropping method). Then, the opposing substrate and the active matrix substrate are attached in vacuum, and a liquid crystal layer 265 filled with the liquid crystal material is formed by using ultraviolet curing. It is to be noted that a dipping method (pumping method) in which the liquid crystal material is injected by using a capillary phenomenon after attaching the opposing substrate to the substrate, can be used for the method for forming the liquid crystal layer 265 instead of the dispensing method (dropping method).

Then, a wiring substrate, typically an FPC (Flexible Printed Circuit), is attached to connecting terminal portions of a scan line and a signal line with a connecting conductive layer interposed therebetween. In accordance with the above steps, the liquid crystal display panel can be formed.

Note that in this embodiment, a TN mode liquid crystal display panel is described; however, the above steps can be similarly applied to other types of liquid crystal display panels. For example, this embodiment can be applied to a transverse electric field liquid crystal display panel in which an electric field is applied in parallel to a glass substrate to align liquid crystal. Further, this embodiment can be applied to a VA (Vertical Alignment) liquid crystal display panel.

Figure 16:
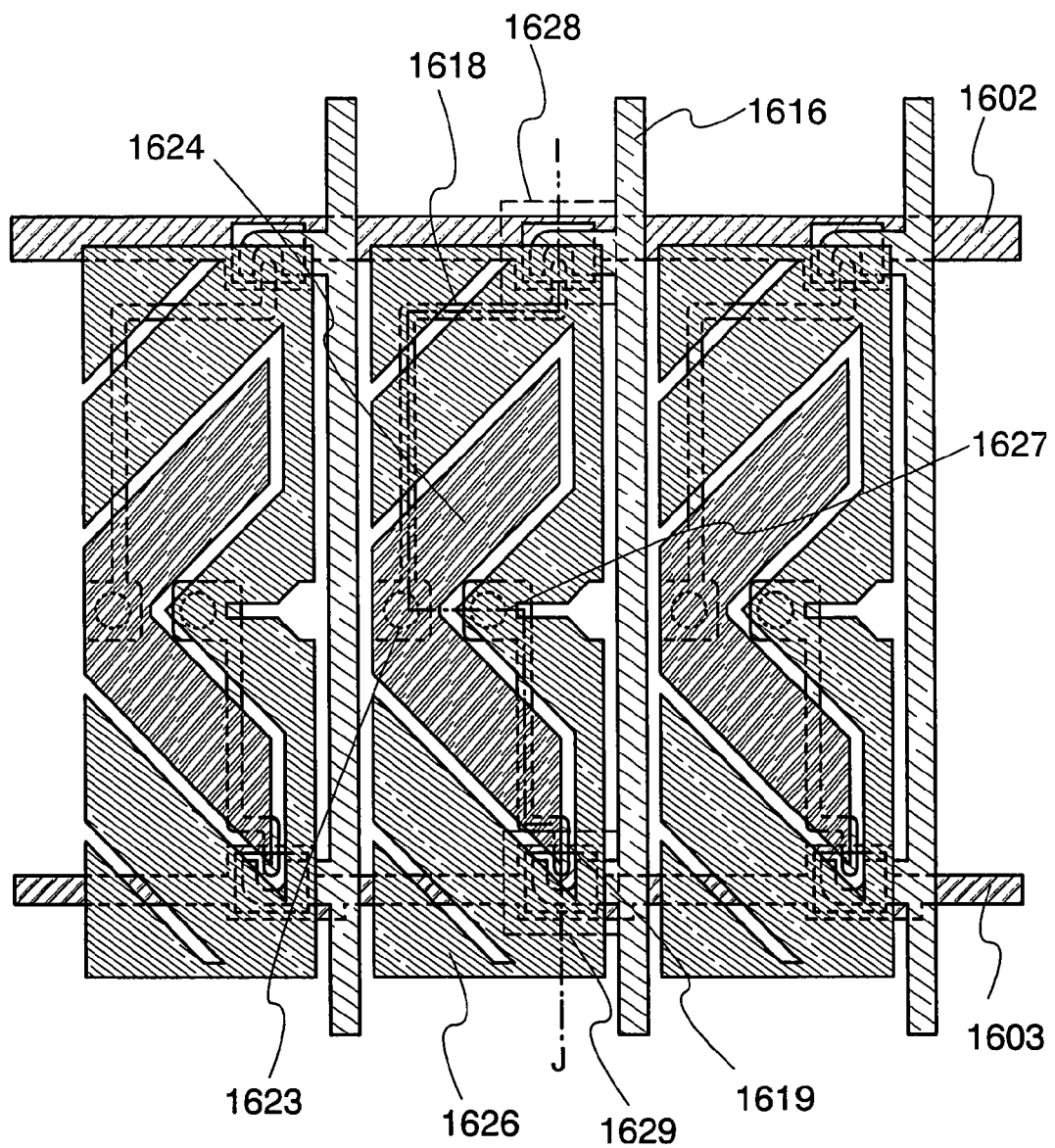
FIG. 16 is a top view illustrating a method of manufacturing a semiconductor device of the present invention.
Figure 17:
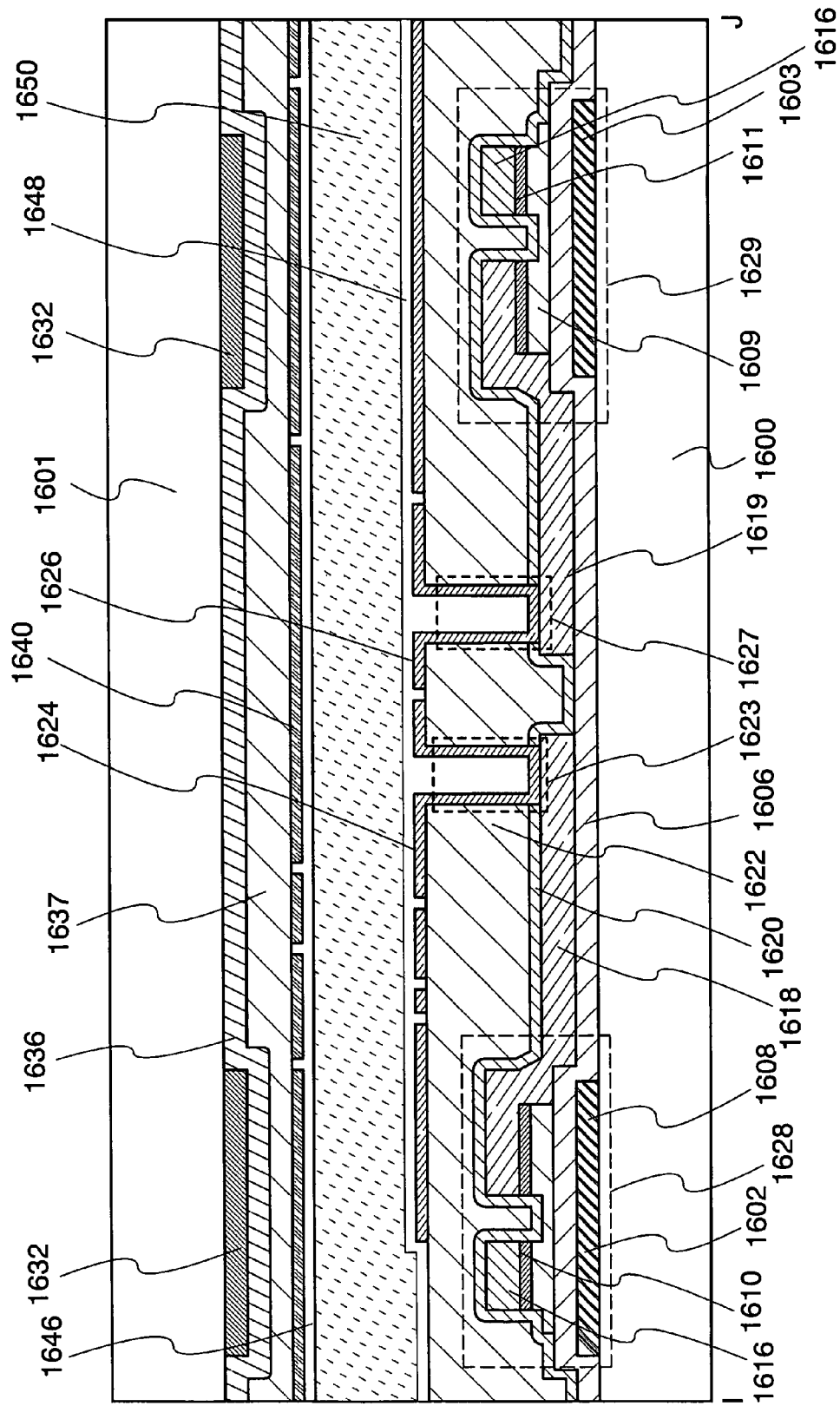
FIG. 17 is a cross-sectional view illustrating a method of manufacturing a semiconductor device of the present invention.

FIGS. 16 and 17 each show a pixel structure of a VA mode liquid crystal panel. FIG. 16 is a top view, and a cross-sectional structure taken along a line I-J is shown in FIG. 17. In the following description, both of these drawings are used.

In this pixel structure, a plurality of pixel electrodes are provided in one pixel, and each pixel electrode is connected to a TFT. Each TFT is constituted so as to be driven by a different gate signal. In other words, a pixel with multi-domains has a structure in which a signal applied to each pixel electrode is independently controlled.

A pixel electrode 1624 is connected to a TFT 1628 with a wiring 1618 through an opening (contact hole) 1623. A pixel electrode 1624 is connected to a TFT 1629 with a wiring 1619 through an opening (contact hole) 1627. A gate wiring 1602 of the TFT 1628 and a gate electrode 1603 of the TFT 1629 are separated so as to be able to receive different gate signals. On the other hand, a wiring 1616 functioning as a data line is used by both the TFTs 1628 and 1629.

The pixel electrodes 1624 and 1626 can be formed as in the above embodiment modes.

Figure 18:
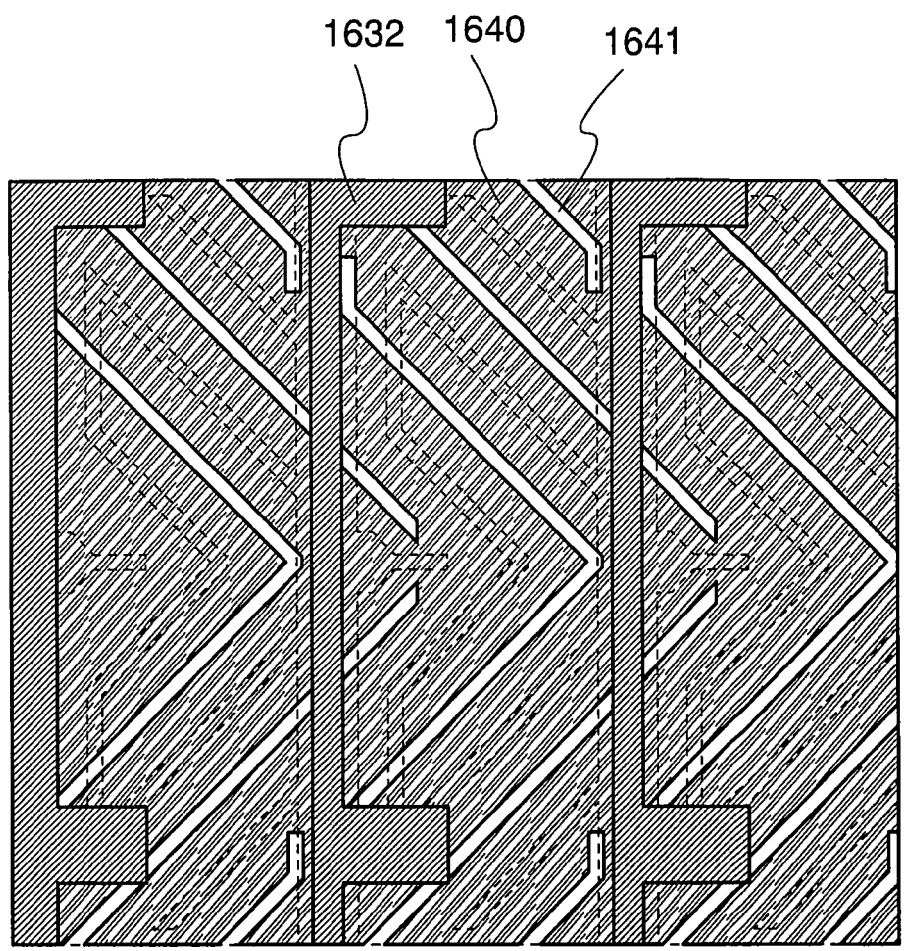
FIG. 18 is a top view illustrating a method of manufacturing a semiconductor device of the present invention.

The shapes of the pixel electrodes 1624 and 1626 are different, and the pixel electrodes 1624 and 1626 are separated by a slit 1625. The pixel electrode 1624 is formed so as to surround the pixel electrode 1624 that is extended into a V-shape. Timings of application of voltage to the pixel electrodes 1624 and 1626 are made different in the TFTs 1628 and 1629, whereby alignment of liquid crystals are controlled. A light-shielding film 1632, a colored layer 1636, and a counter electrode layer 1640 are formed on a counter substrate 1601. A planarizing film 1637 is formed between the colored layer 1636 and the counter electrode layer 1640 so that disordered alignment of liquid crystals is prevented. FIG. 18 shows a structure on the counter substrate side. The counter electrode layer 1640 is used by different pixels in common, and a slit 1641 is formed. The slit 1641 and the slit 1625 on the side of the pixel electrodes 1624 and 1626 are arranged so as to be alternately engaged with each other, and thus, an oblique electric field can be effectively generated and alignment of liquid crystals can be controlled. Accordingly, an alignment direction of the liquid crystals is made varied depending on the place; therefore, the viewing angle can be widened.

This embodiment can be freely combined with any of the embodiment modes as appropriate.

It is to be noted that a protective circuit for preventing electrostatic discharge failure, typically a diode or the like, may be provided between the connecting terminal and a source wiring (or gate wiring), or in the pixel area. In this case, the protective circuit is manufactured through the same steps as the above described TFT. The electrostatic discharge can be prevented by connecting a gate wiring of the pixel area and a drain or a source wiring of the diode.

In accordance with the present invention, components such as a wiring, which forms a liquid crystal display panel can be formed with a desired shape. Further, a complicated photolithography process is eliminated, and a liquid crystal display panel can be manufactured through a simplified process; thus, reduction in material loss and cost can be achieved. Accordingly, high performance/high reliability liquid crystal display panel can be manufactured with high yield.

Embodiment 2

In this embodiment, a method for manufacturing a light-emitting display panel as a semiconductor device will be described. FIGS. 19A to 19D show one pixel of the light-emitting display panel, which will be described below.

Figure 19A:
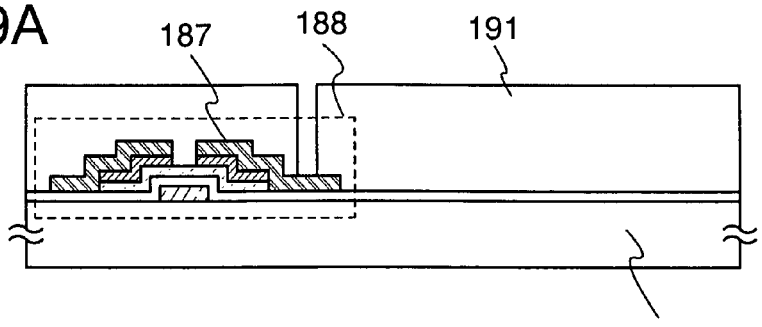
FIGS. 19A to 19D are cross-sectional views illustrating a method of manufacturing a semiconductor device of the present invention.

As shown in FIG. 19A, the thin film transistor 188 shown in Embodiment Mode 2 and the insulating layer 191 having an opening, which covers the thin film transistor 188 are formed over a substrate 100 as in Embodiment 1.

Figure 19B:
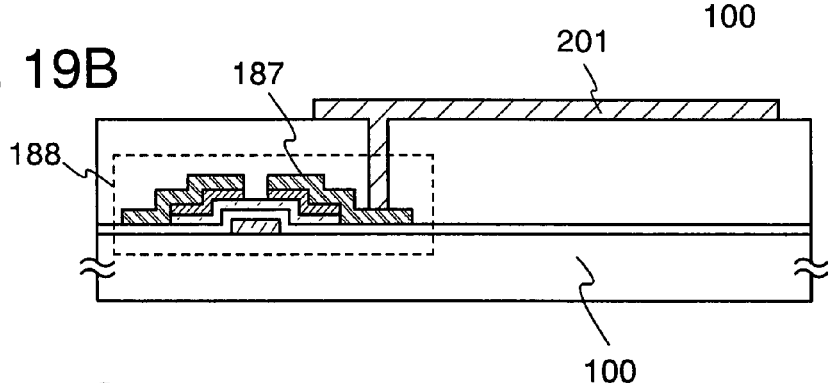

Next, as shown in FIG. 19B, a first conductive layer 201 connected to the wiring 187 is formed as in Embodiment 1 like. Note that the first conductive layer 201 serves as a pixel electrode.

Figure 19C:
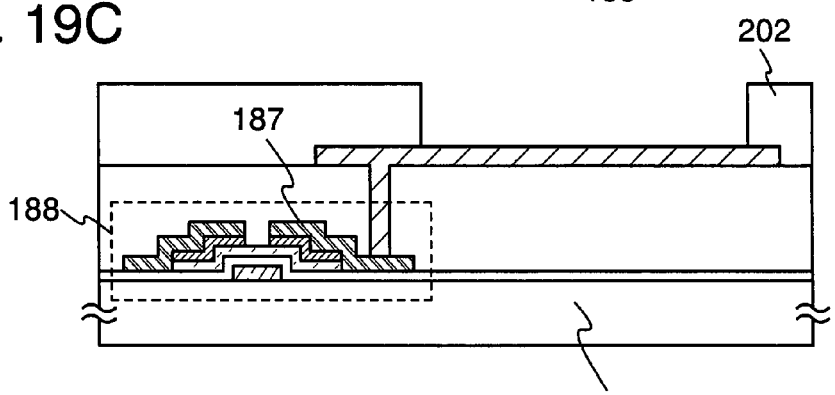

Next, as shown in FIG. 19C, as an insulating layer is formed so as to cover an end portion of the first conductive layer 201 serving as a pixel electrode. As the insulating layer, an insulating layer, not shown, is formed over the insulating layer 191 and the first conductive layer 201, and the insulating layer can be formed by selectively removing the insulating layer over the first conductive layer 201 by a method shown in Embodiment Mode 3.

Figure 19D:
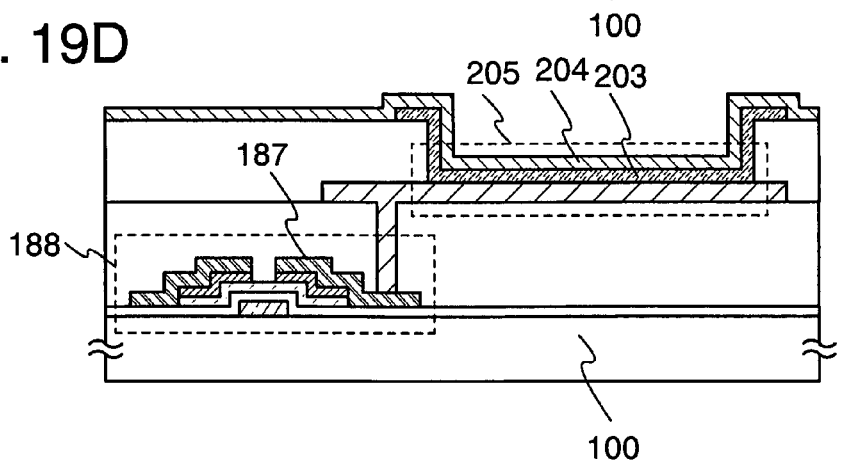

Next, as shown in FIG. 19D, a layer 203 containing a light-emitting material is formed on a part of the first conductive layer 201, which is exposed and part of an insulating layer 202, and a second conductive layer 204 serving as a pixel electrode is form thereon. Through the steps, a light emitting element 205 formed from the first conductive layer 201, the layer 203 containing a light-emitting material, and the conductive layer 204 can be formed.

Here, the structure of the light emitting element 205 will be described.

A layer having a function of emitting light using an organic compound (hereinafter referred to as a light-emitting layer 343) is formed in the layer 203 containing a light-emitting material, which makes the light emitting element 205 operate as an organic EL element.

As the organic compound with a light-emitting property, for example, the following are given: 9,10-di(2-naphthyl) anthracene (abbr.: DNA); 2-tert-butyl-9,10-di(2-naphthyl) anthracene (abbr.: t-BuDNA); 4,4'-bis(2,2-diphenylvinyl)biphenyl (abbr.: DPVBi); coumarin 30; coumarin 6; coumarin 545; coumarin 545T; perylene; rubrene; periflanthene; 2,5,8, 11-tetra(tert-butyl)perylene (abbr.: TBP); 9,10-diphenylanthracene (abbr.: DPA);5,12-diphenyltetracene; 4-(dicyanomethylene)-2-methyl-6-[β-(dimethylamino)styryl]-4H-pyran (abbr.: DCM1); 4-(dicyanomethylene)-2-methyl-6-[2-(julolidine-9-yl)ethenyl]-4H-pyran (abbr.: DCM2); 4-(dicyanomethylene)-2,6-bis[p-(dimethylamino)styryl]-4H-pyran (abbr.: BisDCM); and the like. In addition, the following compound capable of emitting phosphorescent light can also be used: bis[2-(4',6'-difluorophenyl)pyridinato-N,$C^{2'}$](picolinato)iridium (abbr.: FIrpic); bis{2-[3',5'-bis(trifluoromethyl)phenyl]pyridinato-N,$C^{2'}$}(picolinato)iridium(abbr.:Ir($CF_3$ ppy)$_2$(Pic)); tris(2-phenylpyridinato-N,$C^{2'}$)iridium (abbr.: Ir(ppy)$_3$); (acetylacetonato)bis(2-phenylpyridinato-N,$C^{2'}$)iridium (abbr.: Ir(ppy)$_2$(acac)); (acetylacetonato)bis[2-(2'-thienyl)pyridinato-N,$C^{3'}$]iridium (abbr.: Ir(thp)$_2$(acac)); (acetylacetonato)bis(2-phenylquinolinato-N,$C^{2'}$)iridium (abbr.: Ir(pq)$_2$(acac)); (acetylacetonato)bis[2-(2'-benzothienyl)pyridinato-N,$C^{3'}$]iridium (abbr.: Ir(btp)$_2$(acac)); and the like.

Figure 21A:
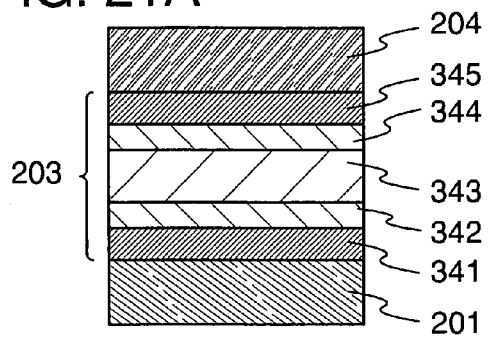
FIGS. 21A to 21E are diagrams each illustrating a cross-sectional structure of a light emitting element, which can be applied to the present invention.

As shown in FIG. 21A, the light emitting element 205 may be formed by the layer 318 containing a light-emitting material and the second conductive layer 204 which are formed over the first conductive layer 201. The layer 203 containing a light-emitting material includes a hole-injecting layer 341 formed of a material with a hole-injecting property, a hole-transporting layer 342 formed of a material with a hole-transporting property, the light-emitting layer 343 formed of an organic compound with a light-emitting property, an electron-transporting layer 344 formed of a material with an electron-transporting property, and an electron-injecting layer 345 formed of a material with an electron-injecting property.

The material with a hole-transporting property includes, but not limited to, phthalocyanine (abbr.: H₂Pc); copper phthalocyanine (abbr.: CuPc); vanadyl phthalocyanine (abbr.: VOPc); 4,4',4"-tris(N,N-diphenylamino)triphenylamine (abbr.: TDATA); 4,4',4"-tris[N-(3-methylphenyl)-N-phenylamino]triphenylamine (abbr.: MTDATA); 1,3,5-tris[N,N-di(m-tolyl)amino]benzene (abbr.: m-MTDAB); N,N'-diphenyl-N,N'-bis(3-methylphenyl)-1,1'-biphenyl-4,4'-diamine (abbr.: TPD); 4,4'-bis[N-(1-naphthyl)-N-phenylamino]biphenyl (abbr.: NPB); 4,4'-bis{N-[4-di(m-tolyl)amino]phenyl-N-phenylamino}biphenyl (abbr.: DNTPD); 4,4'-bis[N-(4-biphenylyl)-N-phenylamino]biphenyl (abbr.: BBPB); 4,4',4"-tri(N-carbazolyl)triphenylamine (abbr.: TCTA); and the like. Among the above compounds, an aromatic amine compound typified by TDATA, MTDATA, m-MTDAB, TPD, NPB, DNTPD, BBPB, TCTA, NPB, or the like is preferable as the organic compound because it easily generates holes. The substances described here mainly have a hole mobility of $10^{-6}$ cm²/Vs or higher.

The material with a hole-injecting property includes a chemically-doped conductive high-molecular compound, in addition to the aforementioned material with a hole-transporting property. For example, polyethylene dioxythiophene (abbr.: PEDOT) doped with polystyrene sulfonate (abbr.: PSS), polyaniline (abbr.: PAni), or the like can also be used. Moreover, a thin film of an inorganic semiconductor such as molybdenum oxide, vanadium oxide, or nickel oxide, or an ultrathin film of an inorganic insulator such as aluminum oxide is also effective.

Here, the material with an electron-transporting property may be a material including a metal complex with a quinoline skeleton or a benzoquinoline skeleton, or the like such as the following: tris(8-quinolinolato)aluminum (abbr.: Alq₃), tris(4-methyl-8-quinolinolato)aluminum (abbr.: Almq₃), bis(10-hydroxybenzo[h]-quinolinato)beryllium (abbr.: BeBq₂), bis(2-methyl-8-quinolinolato)-4-phenylphenolato-aluminum (abbr.: BAlq), or the like. In addition to those, a metal complex having an oxazole ligand or a thiazole ligand, or the like can also be used, such as bis[2-(2-hydroxyphenyl)benzoxazolato]zinc (abbr.: Zn(BOX)₂), or bis[2-(2-hydroxyphenyl)benzothiazolato]zinc (abbr.: Zn(BTZ)₂). Other than the metal complex, 2-(4-biphenylyl)-5-(4-tert-butylphenyl)-1,3,4-oxadiazole (abbr.: PBD), 1,3-bis[5-p-tert-butylphenyl)-1,3,4-oxadiazole-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen), bathocuproin (abbr.: BCP), or the like can be used. The substances mentioned here mainly has an electron mobility of $10^{-6}$ cm²/Vs or more.

As the material with an electron-injecting property, an ultrathin film of an insulator such as the following is often used besides the aforementioned material with an electron-transporting property: a halide of alkali metal such as lithium fluoride or cesium fluoride, a halide of alkaline-earth metal such as calcium fluoride, or an oxide of alkali metal such as lithium oxide. Moreover, an alkali metal complex such as lithium acetyl acetonate (abbr.: Li(acac)) or 8-quinolinolato-lithium (abbr.: Liq) is also effective. In addition, a material mixed by, for example, co-evaporating the aforementioned material with an electron-transporting property and metal with a low work function such as Mg, Li, or Cs can also be used.

Figure 21B:
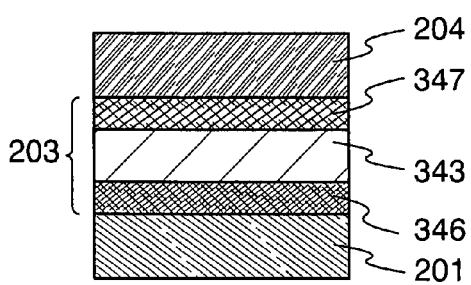

As shown in FIG. 21B, the light emitting element 205 may be formed by the layer 318 containing a light-emitting material and the second conductive layer 204 which are formed over the first conductive layer 201. The layer 318 containing a light-emitting material includes a hole-transporting layer 346 formed of an organic compound and an inorganic compound having an electron-accepting property with respect to the organic compound, the light-emitting layer 343 formed of an organic compound with a light-emitting property, and an electron-transporting layer 347 formed of an inorganic compound having an electron-donating property with respect to the organic compound with a light-emitting property.

As the organic compound of the hole-transporting layer 346 formed of the organic compound with a light-emitting property and the inorganic compound having an electron-accepting property with respect to the organic compound with a light-emitting property, the aforementioned organic compound with a hole-transporting property can be used. In addition, the inorganic compound may be any kind of compound as long as it can easily accept electrons from the organic compound. As the inorganic compound, various metal oxides or metal nitrides can be used. In particular, an oxide of transition metal belonging to any of Group 4 to Group 12 in the periodic table is preferable because it easily exhibits an electron-accepting property. Specifically, titanium oxide, zirconium oxide, vanadium oxide, molybdenum oxide, tungsten oxide, rhenium oxide, ruthenium oxide, zinc oxide, or the like is given. Among these metal oxides, oxides of transition metal belonging to Group 4 to Group 8 in the periodic table are preferable because many of them have a high electron-accepting property. In particular, vanadium oxide, molybdenum oxide, tungsten oxide, and rhenium oxide are preferable because they can be formed by vacuum deposition and easily treated.

As the organic compound of the electron-transporting layer 347 formed of the organic compound with a light-emitting property and the inorganic compound having an electron-donating property with respect to the organic compound with a light-emitting property, the aforementioned organic compound with an electron-transporting property can be used. In addition, the inorganic compound may be any kind of compound as long as it can easily donate electrons to the organic compound. As the inorganic compound, various metal oxides or metal nitrides can be used. In particular, an oxide of alkali metal, an oxide of alkaline-earth metal, an oxide of rare-earth metal, a nitride of alkali metal, a nitride of alkaline-earth metal, and a nitride of rare-earth metal are preferable because they easily exhibit an electron-donating property. Specifically, lithium oxide, strontium oxide, barium oxide, erbium oxide, lithium nitride, magnesium nitride, calcium nitride, yttrium nitride, lanthanum nitride, and the like are given. In particular, lithium oxide, barium oxide, lithium nitride, magnesium nitride, and calcium nitride are preferable because they can be formed by vacuum deposition and easily treated.

The electron-transporting layer 347 or the hole-transporting layer 346 formed of the organic compound with a light-emitting property and the inorganic compound is superior in electron injecting/transporting properties; therefore, various materials can be used for the first conductive layer 201 and the second conductive layer 204 with their work functions hardly limited. Moreover, the drive voltage can be reduced.

In addition, the light emitting element 205 functions as an inorganic EL element by having a layer which uses an inorganic compound and which has a light-emitting function (this layer is hereinafter called a light-emitting layer 349) as the layer 203 containing a light-emitting material. The inorganic EL elements are classified according to their element structures into a dispersed inorganic EL element and a thin-film inorganic EL element. They are different from each other in that the former includes a light emitting layer in which particles of a light emitting material are dispersed in a binder and the latter includes a light emitting layer formed of a thin film of a phosphor material. However, they are common in that they both require electrons accelerated by a high electric field. Note that the mechanism of light emission to be obtained includes donor-acceptor recombination light emission which uses a donor level and an acceptor level, and local light emission which uses core electron transition of a metal ion. In many cases, a dispersed inorganic EL element uses donor-acceptor recombination light emission whereas a thin-film inorganic EL element uses local light emission. A structure of the inorganic EL element is shown below.

The light-emitting material that can be used in Embodiment Mode 3 includes a base material and an impurity element to become a light emission center, and can emit light with various colors by changing the impurity element to be contained. The light-emitting material can be manufactured by various methods such as a solid phase method and a liquid phase method (coprecipitation method). As a liquid phase method, a spray pyrolysis method, a double decomposition method, a method by precursor pyrolysis, a reverse micelle method, a method in which the above method is combined with high-temperature baking, or a freeze-drying method can be used.

In the solid phase method, a base material and an impurity element are weighed, mixed in a mortar, and reacted with each other by being heated and baked in an electric furnace so that the impurity element is contained in the base material. Baking temperatures are preferably 700° C. to 1500° C. This is because solid phase reaction does not progress at a temperature that is too low and the base material is decomposed at a temperature that is too high. The baking may be performed to the base material and the impurity element in a powder state; however, it is preferable to perform baking in a pellet state. This method requires baking at a comparatively high temperature but is simple; thus, this method has high productivity and is suitable for mass production.

In the liquid-phase method (coprecipitation method), a base material or a compound thereof, and an impurity element or a compound thereof are reacted with each other in a solution and dried, and thereafter, they are baked. In this method, particles of the light-emitting material are uniformly dispersed, and reaction can progress even at a low baking temperature and with the particles each having a small diameter.

As the base material used for the light emitting material of an organic EL element, a sulfide, an oxide, or a nitride can be used. As the sulfide, for example, zinc sulfide, cadmium sulfide, calcium sulfide, yttrium sulfide, gallium sulfide, strontium sulfide, barium sulfide, or the like can be used. As the oxide, for example, zinc oxide, yttrium oxide, or the like can be used. Further, as the nitride, for example, aluminum nitride, gallium nitride, indium nitride, or the like can be used. In addition, zinc selenide, zinc telluride, or the like can also be used. A ternary mixed crystal such as calcium-gallium sulfide, strontium-gallium sulfide, or barium-gallium sulfide may also be used.

As the light emission center of local light emission, manganese (Mn), copper (Cu), samarium (Sm), terbium (Tb), erbium (Er), thulium (Tm), europium (Eu), cerium (Ce), praseodymium (Pr), or the like can be used. A halogen element such as fluorine (F) or chlorine (Cl) may be added as charge compensation.

On the other hand, a light-emitting material including a first impurity element forming a donor level and a second impurity element forming an acceptor level may be used as the light emission center of donor-acceptor recombination light emission. For example, fluorine (F), chlorine (Cl), aluminum (Al), or the like can be used as the first impurity element, and copper (Cu), silver (Ag), or the like can be used as the second impurity element.

In a case of synthesizing a light-emitting material of donor-acceptor recombination light emission by a solid phase method, a base material, the first impurity element or a compound thereof, and the second impurity element or a compound thereof are weighed, mixed in a mortar, and heated and baked in an electric furnace. The aforementioned base material can be used as the base material. As the first impurity element or the compound thereof, for example, fluorine (F), chlorine (Cl), aluminum sulfide, or the like can be used. As the second impurity element or the compound thereof, for example, copper (Cu), silver (Ag), copper sulfide, silver sulfide, or the like can be used. Baking temperatures preferably range from 700° C. to 1500° C. This is because solid phase reaction does not progress at a temperature that is too low and the base material is decomposed at a temperature that is too high. The baking may be performed on the base material and the impurity element in a powder state; however, it is preferable to perform baking in a pellet state.

As the impurity element in the case of using the solid phase reaction, a compound including the first impurity element and the second impurity element may be used in combination. In this case, the impurity element easily disperses so as to promote solid phase reaction. Therefore, a uniform light-emitting material can be obtained. Moreover, since no excessive impurity elements are included, a light-emitting material with high purity can be obtained. As the compound including the first impurity element and the second impurity element at that time, for example, copper chloride, silver chloride, or the like can be used.

Note that the concentration of these impurity elements may be in the range of 0.01 atom % to 10 atom %, preferably in the range of 0.05 atom % to 5 atom %, with respect to the base material.

Figure 21C:
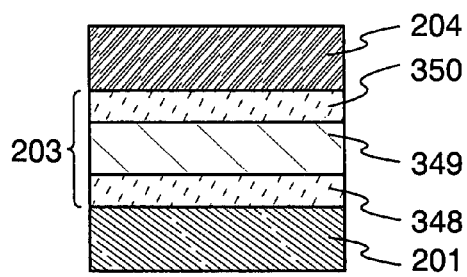

FIG. 21C shows a cross section of an inorganic EL element in which the layer 203 containing a light-emitting material is formed by a first insulating layer 348, the light-emitting layer 349, and a second insulating layer 350.

In the case of a thin film inorganic EL element, the light-emitting layer 349 is a layer containing the aforementioned light-emitting material and can be formed by a vacuum deposition method such as a resistance heating evaporating method or an electron beam evaporation (EB evaporation) method, a physical vapor deposition (PVD) method such as a sputtering method, a chemical vapor deposition (CVD) method such as an organic metal CVD method or a low-pressure hydride transport CVD method, an atomic layer epitaxy (ALE) method, or the like.

The first insulating layer 348 and the second insulating layer 350 are not particularly limited; however, they preferably have dense film quality and moreover have insulating properties. For example, a film of silicon oxide, yttrium oxide, aluminum oxide, hafnium oxide, tantalum oxide, barium titanate, strontium titanate, lead titanate, silicon nitride, zirconium oxide, or the like; a film in which these are mixed; or a laminate of two or more of them can be used. The first insulating layer 348 and the second insulating layer 350 can be formed by sputtering, evaporation, CVD, or the like. Their film thicknesses are not limited in particular, but are preferably in the range of 10 nm to 1000 nm. Since the light-emitting element of this embodiment does not always require hot electrons, the light-emitting element can be formed to be a thin film and has an advantage of low drive voltage. The film thickness is preferably 500 nm or less, more preferably 100 nm or less.

Although not shown, a buffer layer may be provided between the light-emitting layer 349 and the insulating layers 348 and 350 or between the light-emitting layer 349 and the first conductive layer 201 and the second conductive layer 204. The buffer layer facilitates carrier injection and has a role of suppressing mixture of the both layers. The material of the buffer layer is not particularly limited; for example, zinc sulfide, selenium sulfide, cadmium sulfide, strontium sulfide, barium sulfide, copper sulfide, lithium fluoride, calcium fluoride, barium fluoride, magnesium fluoride, or the like, which is the base material of the light-emitting layer, can be used.

Figure 21D:
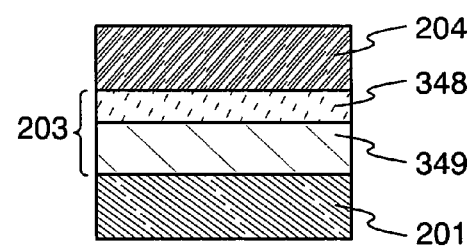

As shown in FIG. 21D, the layer 203 containing a light-emitting material may be formed by the light-emitting layer 349 and the first insulating layer 348. In this case, in FIG. 21D, the first insulating layer 348 is provided between the second conductive layer 204 and the light-emitting layer 349. It is to be noted that the first insulating layer 348 may be provided between the first conductive layer 201 and the light-emitting layer 349.

Moreover, the layer 203 containing a light-emitting material may be formed by only the light-emitting layer 349. In other words, the light emitting element 205 may be formed from the first conductive layer 201, the layer 203 containing a light-emitting material, and the second conductive layer 204.

In the case of a dispersed inorganic EL element, a film-form layer containing a light-emitting material is formed by dispersing particles of light-emitting material in a binder. When particles with desired size cannot be obtained sufficiently depending on the manufacturing method of the light-emitting material, the material may be crushed in a mortar or the like to be processed into particles. The binder is a substance to fix the particles of the light-emitting material in a dispersed state and to keep the shape as the layer containing a light-emitting material. The light-emitting material is thus fixed in such a way that the light-emitting material is uniformly dispersed in the layer containing the light-emitting material by the binder.

In the case of the dispersed inorganic EL element, the layer containing a light-emitting material can be formed by a droplet discharging method that can selectively form the layer containing the light-emitting material, a printing method (such as screen printing or offset printing), a coating method such as a spin coating method, a dipping method, a dispensing method, or the like. The film thickness of the layer at that time is not particularly limited; however, it is preferably in the range of 10 nm to 1000 nm. In the layer containing a light-emitting material, which includes the light-emitting material and the binder, the proportion of the light-emitting material is preferably in the range of 50 wt % to 80 wt %.

Figure 21E:
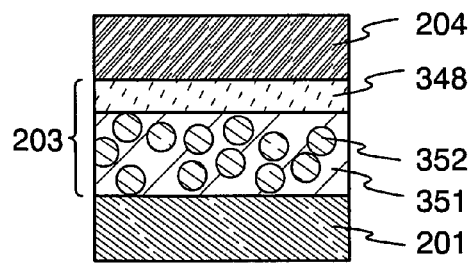

An element shown in FIG. 21E has the first conductive layer 201, the layer 203 containing a light-emitting material, and the second conductive layer 204. The layer 203 containing a light-emitting material is formed by the insulating layer 348 and a light-emitting layer in which a light-emitting material 352 is dispersed in a binder 351. The insulating layer 348 is in contact with the second conductive layer 204 in FIG. 21E; however, the insulating layer 348 may be in contact with the first conductive layer 201. Further, insulating layers may be formed in contact with the first conductive layer 201 and the second conductive layer 204. Moreover, the insulating layer does not have to be in contact with the first conductive layer 201 and the second conductive layer 204 in the element.

As the binder that can be used in this embodiment, an organic material or an inorganic material can be used. Further, a mixed material of an organic material and an inorganic material can be used. As the organic material, polymer with a comparatively high dielectric constant such as a cyanoethylcellulose-based resin, a polyethylene-based resin, a polypropylene-based resin, a polystyrene-based resin, a silicone resin, an epoxy resin, vinylidene fluoride, or the like can be used. Moreover, a heat-resistant high-molecular material such as aromatic polyamide or polybenzimidazole, or a siloxane resin can be used. Note that a siloxane resin corresponds to a resin including a Si—O—Si bond, and siloxane includes a bond of silicon (Si) and oxygen (O) in its skeleton. As the substituent, an organic group including at least hydrogen (for example, an alkyl group and an aryl group) is used. In addition, a fluoro group may be used as the substituent. Furthermore, an organic group including at least hydrogen and a fluoro group may be used as the substituent. In addition, a vinyl resin such as polyvinyl alcohol or polyvinyl butyral, a resin material such as a phenol resin, a novolac resin, an acrylic resin, a melamine resin, a urethane resin, or an oxazole resin (polybenzoxazole) may be used. Moreover, a photo curable type is also applicable. The dielectric constant can be adjusted by appropriately mixing fine particles with a high dielectric constant such as barium titanate or strontium titanate in these resins.

As the inorganic material used for the binder, silicon oxide, silicon nitride, silicon including oxygen and nitrogen, aluminum nitride, aluminum including oxygen and nitrogen, aluminum oxide, titanium oxide, barium titanate, strontium titanate, lead titanate, potassium niobate, lead niobate, tantalum oxide, barium tantalate, lithium tantalate, yttrium oxide, zirconium oxide, zinc sulfide, or another inorganic material can be used. When the organic material is mixed with the inorganic material with a high dielectric constant (by addition or the like), the dielectric constant of the layer containing a light-emitting material, which includes the light-emitting material and the binder can be controlled more accurately so as to increase further.

In the manufacturing process, the light-emitting material is dispersed in a solution including the binder. A solvent of the solution including the binder which is applicable to this embodiment is preferably a solvent in which the binder material is dissolved and which can manufacture a solution with its viscosity suitable for a method of forming the light-emitting layer (each wet process) and a desired film thickness. As such a solvent, an organic solvent or the like can be used. For example, in a case of using a siloxane resin as the binder, propylene glycol monomethylether, propylene glycol monomethylether acetate (also called PGMEA), 3-methoxy-3-methyl-1-butanol (also called MMB), or the like can be used.

The inorganic EL light-emitting element emits light by application of voltage between a pair of electrodes which sandwiches the layer containing a light-emitting material and can be operated by either DC drive or AC drive.

Here, as for a light-emitting element expressing a red color, an ITO layer containing silicon oxide is formed to a thickness of 125 nm as the second conductive layer 204 which serves as a first pixel electrode. As the light-emitting layer, DNTPD formed in 50 nm, NPB formed to a thickness of 10 nm, NPB doped with bis[2,3-bis(4-fluorophenyl)quinoquixalinato]iridium(acetylacetonate) (abbreviated to Ir(Fdpq)$_2$(acac)) which is formed to a thickness of 30 nm, Alq$_3$ formed to a thickness of 30 nm, and lithium fluoride formed to a thickness of 1 nm are stacked. As a third conductive layer which serves as a second pixel electrode, an Al layer is formed to a thickness of 200 nm.

As for a light-emitting element expressing a green color, an ITO layer containing silicon oxide is formed to a thickness of 125 nm as the second conductive layer which serves as the first pixel electrode. As the light-emitting layer, DNTPD formed to a thickness of 50 nm, NPB formed to a thickness of 10 nm, $Alq_3$ doped with coumarin 545T (C545T) which is formed in 40 nm thick, $Alq_3$ formed in 30 nm thick, and lithium fluoride formed to a thickness of 1 nm are stacked. As the third conductive layer which serves as the second pixel electrode, an Al layer is formed to a thickness of 200 nm.

Further, as for a light-emitting element expressing a blue color, an ITO layer containing silicon oxide is formed to a thickness of 125 nm as the first pixel electrode. As the light-emitting layer, DNTPD formed to a thickness of 50 nm, NPB formed to a thickness of 10 nm, 9-[4-(N-carbazolyl)]phenyl-10-phenylanthracene (abbreviated to CzPA) doped with 2,5,8,11-tetra(tert-butyl)perylene (abbreviated to TBP) which is formed to a thickness of 30 nm, $Alq_3$ formed to a thickness of 30 nm, and lithium fluoride formed to a thickness of 1 nm are stacked. As the second pixel electrode, an Al layer is formed to a thickness of 200 nm.

Next, a protective film is preferably formed over the conductive layer 204.

After that, a wiring substrate, typically, an FPC (Flexible Print Circuit) is attached to connection terminal portions of a scan line and a signal line with a conductive layer. Through the above steps, a light-emitting display panel can be formed.

Note that a protective circuit for preventing electrostatic discharge damage, typically, a diode or the like may be provided between the connection terminal and a source wiring (gate wiring) or in a pixel area.

Figure 22A:
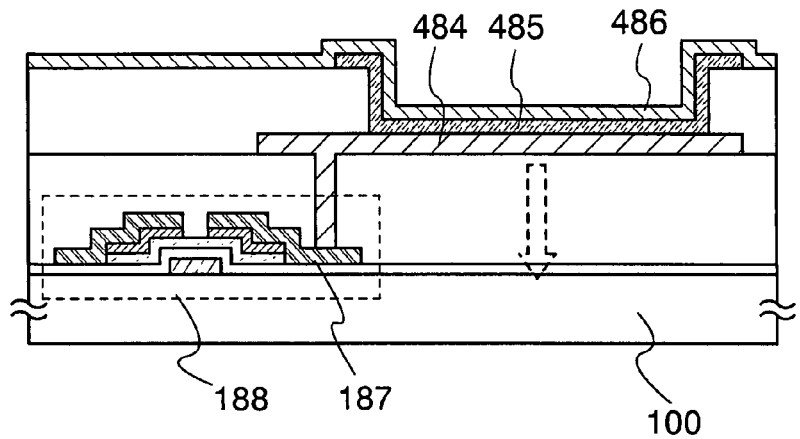
FIGS. 22A to 22C are diagrams each illustrating a cross-sectional structure of a light emitting element, which can be applied to the present invention.

Here, regarding light-emitting display panels having light emitting elements shown in FIGS. 21A and 21B, the case where light is emitted toward a substrate 100, in other words, the case where bottom emission is performed will be explained with reference to FIG. 22A. In this case, a light-transmitting conductive layer 484 in contact with the wiring 187 to be electrically connected to the thin film transistor 188, a layer 485 containing a light-emitting material, and a conductive layer 486 having light-transmitting or reflective properties are sequentially stacked. The substrate 100 through which light passes is required to transmit at least light in the visible region.

Figure 22B:
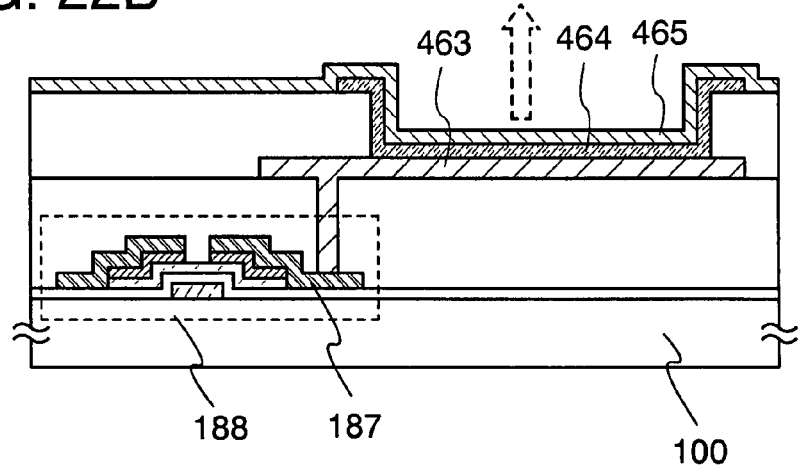

Next, the case where light is emitted to the side opposite to a substrate 100, in other words, the where top emission is performed, will be explained with reference to FIG. 22B. The thin film transistor 188 can be formed in a similar manner to the above described thin film transistor. A wiring 187 electrically connected to the thin film transistor 188 is in contact with and electrically connected to a conductive layer 463 which has light-transmitting or reflective properties. The conductive layer 463 which has light-transmitting or reflective properties, a layer 464 containing a light-emitting material, and a conductive layer 465 having light-transmitting properties are sequentially laminated. The conductive layer 463 is a metal layer which has light-transmitting or reflective properties and reflects light emitted from the light emitting element upward as shown by the arrow. Note that a conductive layer may be formed over the 463 which has light-transmitting or reflective properties. The light emitted from the light emitting element goes out of the light emitting element through the conductive layer 465.

Figure 22C:
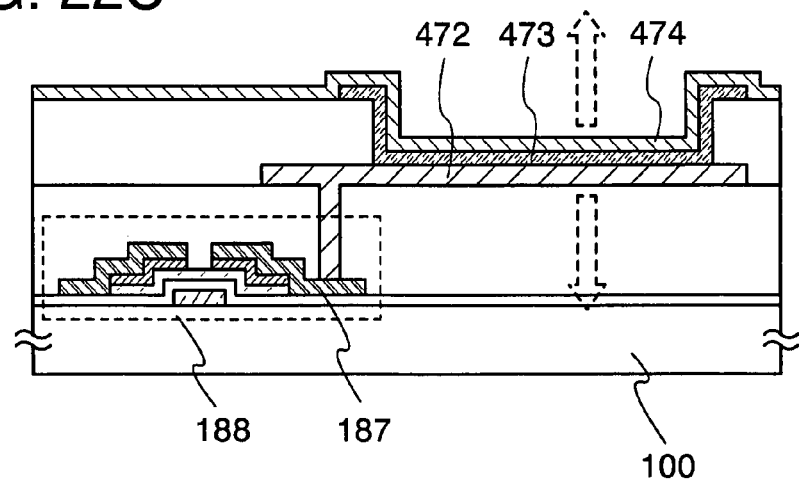
Figure 23:
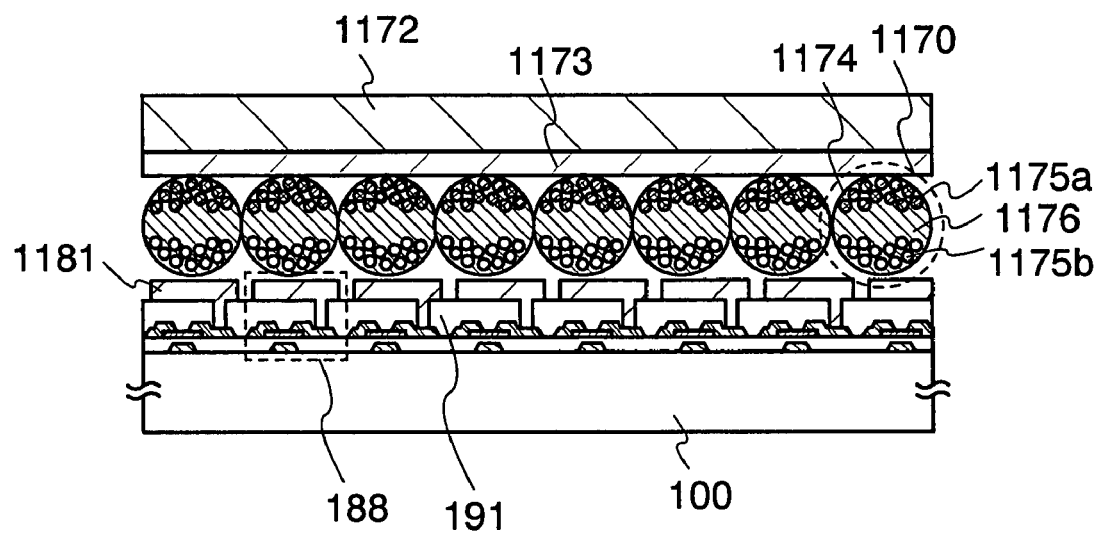
FIG. 23 is a cross-sectional view illustrating a method of manufacturing a semiconductor device of the present invention.

Next, the case where light is emitted both toward the substrate 100 and to the side opposite thereto, in other words, the case where dual emission is performed, will be explained with reference to FIG. 22C. A wiring 187 electrically connected to a semiconductor layer of the thin film transistor 188 is electrically connected to a first light-transmitting conductive layer 472. The first light-transmitting conductive layer 472, a layer 473 containing a light-emitting material, and a second light-transmitting conductive layer 474 are sequentially laminated. When both the first light-transmitting conductive layer 472 and the second light-transmitting conductive layer 474 are formed using a material which transmits at least light in the visible region or formed to have such thicknesses that light can be transmitted; thus, dual emission is realized. In this case, an insulating layer and the substrate 100 through which light passes are also required to transmit at least light in the visible region.

Here, a pixel circuit of a light-emitting display panel having a light emitting element shown in FIGS. 21A and 21B and its operational structure will be described with reference to FIGS. 20A to 20C. For the operational structure of the light-emitting display panel in a display device in which video signals are digital, there is a configuration in which video signals to be input to a pixel is regulated by voltage, and a configuration in which they are regulated by current. As the configuration in which video signals are regulated by voltage, there is one where voltage applied to a light emitting element is constant (CVCV), and one where current applied to the light emitting element is constant (CVCC). Also, as the configuration in which video signals are regulated by current, there is one where voltage applied to the light emitting element is constant (CCCV), and one where current applied to the light emitting element is constant (CCCC). This embodiment describes a pixel of a CVCV operation with reference to FIGS. 20A and 20B. Further, a pixel of a CVCC operation is described with reference to FIG. 20C.

Figure 20A:
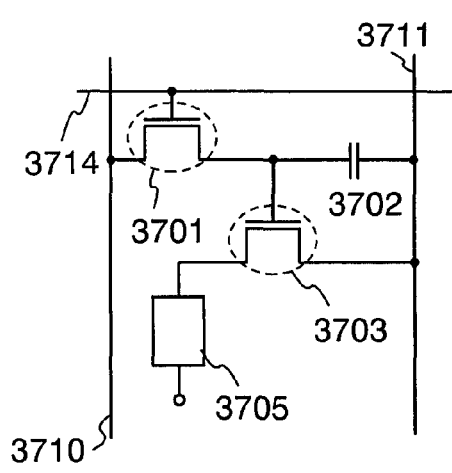
FIGS. 20A to 20C are diagrams each illustrating an equivalent circuit of a light emitting element which can be applied to the present invention.
Figure 20B:
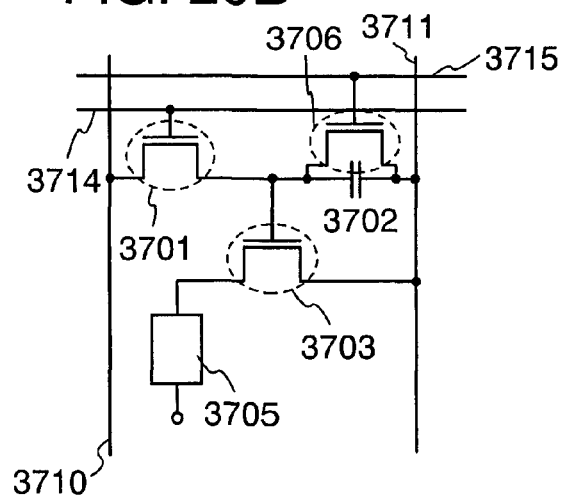
Figure 20C:
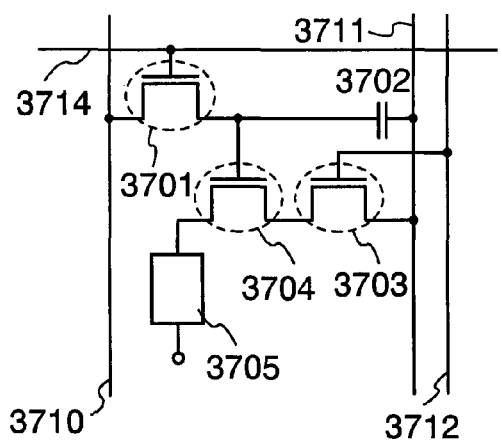

In the pixel shown in each of FIGS. 20A and 20B, a signal line 3710 and a power source line 3711 are arranged in a column direction and a scan line 3714 is arranged in a row direction. Also, a switching TFT 3701, a driving TFT 3703, a capacitor element 3702, and a light emitting element 3705 are included.

Note that the switching TFT 3701 and the driving TFT 3703 are operated in a linear region when they are turned on. Also, the driving TFT 3703 has a role of controlling whether voltage is applied to the light emitting element 3705. It is favorable in terms of a manufacturing step if both the switching TFT 3701 and the driving TFT 3703 have the same conductivity type. Also, as the driving TFT 3703, a depletion mode TFT may be used in addition to an enhancement mode TFT.

In the pixel shown in each of FIGS. 20A and 20B, the switching TFT 3701 controls input of video signals to the pixel, and when the switching TFT 3701 is turned on, video signals are input inside the pixel. Then, voltage of the video signals is retained in the capacitor element 3702.

In FIG. 20A, in a case where the potential of the power source line 3711 is Vss and the potential of an opposing electrode of the light emitting element 3705 is Vdd, the opposing electrode of the light emitting element is an anode, and an electrode of the light emitting element connected to the driving TFT 3703 is a cathode. In this case, luminance variation due to characteristic variation of the driving TFT 3703 can be suppressed.

In FIG. 20A, in a case where the potential of the power source line 3711 is Vdd and the potential of the opposing electrode of the light emitting element 3705 is Vss, the opposing electrode of the light emitting element is a cathode, and the electrode of the light emitting element connected to the driving TFT 3703 is an anode. In this case, luminance variation due to characteristic variation of the driving TFT 3703 can be suppressed.

The pixel shown in FIG. 20B has the same pixel configuration as that shown in FIG. 20A except that in FIG. 20B, a TFT 3706 and a scan line 3715 are added.

Turning on or off of the TFT 3706 is controlled by the newly placed scan line 3715. When the TFT 3706 is turned on, a charge retained in the capacitor element 3702 is discharged, and the driving TFT 3703 is turned off. In other words, according to a placement of the TFT 3706, a state in which current is not fed to the light emitting element 3705 can be created forcefully. Therefore, the TFT 3706 can be called an erasing TFT. Consequently, in the configuration in FIG. 20B, a duty ratio of light emission can be improved since a lighting period can be started at the same time as or right after a start of a writing period, without waiting for signals to be written to all pixels.

In a pixel having the foregoing operational structure, a current value of the light emitting element 3705 can be determined by the driving TFT 3703 which operates in the linear region. By the foregoing configuration, characteristic variation of TFTs can be suppressed, luminance irregularity of light emitting elements due to the characteristic variations of the TFTs can be improved, and a display device with improved image quality can be provided.

Next, a pixel of a CVCC operation is described with reference to FIG. 20C. The pixel shown in FIG. 20C has a pixel configuration shown in FIG. 20A with a power source line 3712 and a current control TFT 3704 provided in addition. Note that in the pixel shown in FIG. 20C, the gate electrode of the driving TFT 3703 is connected to the power line 3712 which is arraned in columns; however, it may be connected to power line 3712 which is arranged in rows instead.

Note that the switching TFT 3701 operates in the linear region, and the driving TFT 3703 operates in a saturation region. Also, the driving TFT 3703 has a role of controlling a current value fed to the light emitting element 3705, and the current control TFT 3704 operates in the saturation region has a role of controlling supply of current to the light emitting element 3705.

Note that in the pixels shown in FIGS. 20A and 20B, CVCC operations are also possible. Also, for pixels having the operational structures shown in FIG. 20C, respectively, similarly to FIGS. 20A and 20B, Vdd and Vss can be appropriately changed depending on a direction in which current of a light emitting element flows.

In a pixel having the foregoing configuration, since the current control TFT 3704 operates in the linear region, a small shift in Vgs of the current control TFT 3704 does not have an effect on the current value of the light emitting element 3705. In other words, the current value of the light emitting element 3705 can be determined by the driving TFT 3703 which operated in the saturation region. By the foregoing configuration, luminance irregularity of light emitting elements due to characteristic variations of TFTs can be improved, and a display device with improved image quality can be provided.

In particular, in the case of forming a thin film transistor having amorphous semiconductor or the like, when the area of the semiconductor film of the driving TFT is increased, variations of TFTs can be reduced, which is preferable. Further, pixels shown in FIG. 20A and FIG. 20B has a small number of TFTs; therefore, the aperture ratio can be increased.

Note that although a configuration in which the capacitor element 3702 is provided is shown, the present invention is not limited thereto, and in a case where a capacity for retaining video signals can be covered by a gate capacitance, the capacitor element 3702 is not required to be provided.

Further, when a semiconductor layer of a thin film transistor is formed of an amorphous semiconductor film, threshold voltage easily shifts; therefore, a circuit which corrects the threshold voltage is preferably provided in the pixel or near the pixel.

Such an active matrix light emitting display device can be driven at low voltage when the pixel density is increased because a TFT is provided in each pixel, which is advantageous. On the other hand, a passive matrix light emitting display device can be formed. A passive matrix light emitting display device makes it possible to obtain high aperture ratio because not every pixel has a TFT.

Further, in a display device of the present invention, a driving method of a screen display is not particularly limited, and for example, a dot sequential driving method, a line sequential driving method, an area sequential driving method, or the like may be used. Typically, the line sequential driving method is used, and a time division gray scale driving method or an area dray scale driving method may be appropriately used. Further, image signals input to a source line of the display device may be analog signals, or digital signals, and a driver circuit and the like may be designed appropriately according to the image signals.

As described above, various kinds of pixel circuits can be adopted.

Embodiment 3

In this embodiment, typical examples of a semiconductor layer will be described with reference to FIG. 23 and FIGS. 24A to 24D. An electrophoresis element means an element in which a microcapsule containing black and white particles which are charged positively and negatively is arranged between the first conductive layer and the second conductive layer, and a potential difference is generated between the first conductive layer and the second conductive layer, so that the black and white particles can move between the first and second conductive layers to perform display.

Next, similarly to Embodiment 1, as shown in FIG. 23A, the thin film transistor 188 and the insulating layer 191 having an opening, which covers the thin film transistor 188 that are shown in Embodiment 1 are formed over the substrate 100.

Next, similarly to Embodiment 1, a first conductive layer 1181 connected to the wiring 187 is formed. Note that the first conductive layer 1181 functions as a pixel electrode. Here, the first conductive layer 1181 is formed using aluminum by a method shown in Embodiment Mode 1.

Further, a second conductive layer 1173 is formed over a substrate 1172. Here, the second conductive layer 1173 is formed using zinc oxide by a method shown in Embodiment Mode 1.

Next, the substrate 100 and the substrate 1172 are attached to each other using a sealing material. At that time, microcapsules 1170 are dispersed between the first conductive layer 1181 and the second conductive layer 1173 to form an electrophoresis element between the substrate 100 and the substrate 1172. The electrophoresis element includes the first conductive layer 1181, the microcapsules 1170, and the second conductive layer 1173. In addition, the microcapsules 1170 are fixed between the first conductive layer 1181 and the second conductive layer 1173 with a binder.

Figure 24A:
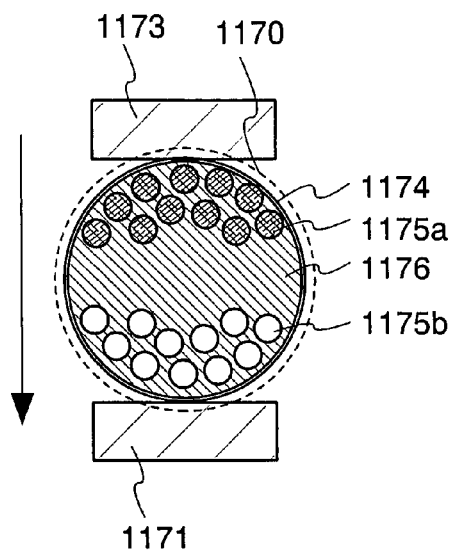
FIGS. 24A to 24D are diagrams each illustrating a cross-sectional structure of an electrophoresis element applicable to the present invention.
Figure 24B:
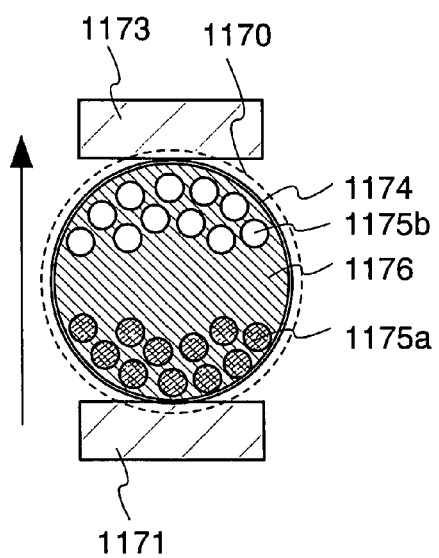
Figure 24C:
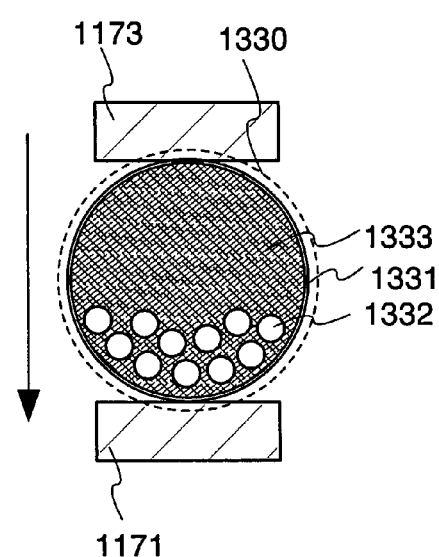
Figure 24D:
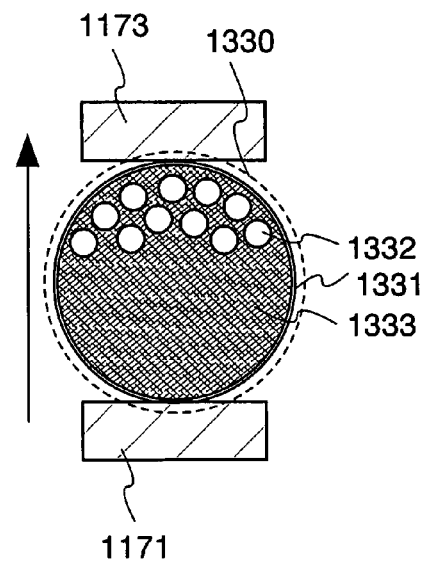

Next, a structure of the microcapsules will be described with reference to FIGS. 24A to 24D. As shown in FIGS. 24A and 24B, in the microcapsules 1170, transparent dispersion medium 1176, charged black particles 1175a, and charged white particles 1175b are sealed in fine transparent containers 1174. Note that blue particles, red particles, green particles, yellow particles, blue-green particles, or purplish red particles may be used instead of the black particles 1175a. Further, as shown in FIGS. 24C and 24D, microcapsules 1330 in which colored dispersion medium 1333 and white particles 1332 are dispersed in fine transparent containers 1331 may be used. Note that the colored dispersion medium 1333 may be colored in any of black, blue, red, green, yellow, blue green, and purplish red. In addition, when microcapsules in which blue particles are dispersed, red particles are dispersed, and green particles are dispersed, respectively are provided in one pixel; color display can be performed. In addition, when microcapsules in which yellow particles are dispersed, blue green particles are dispersed, and purplish red particles are dispersed, respectively are provided in one pixel; color display can be performed. Further, when microcapsules in which white particles or black particles are dispersed in blue dispersion medium, white particles or black particles are dispersed in red dispersion medium, and white particles or black particles are dispersed in green dispersion medium, respectively are arranged in one pixel, and each of the microcapsules includes either white particles or black particles; color display can be performed. In addition, when microcapsules in which white particles or black particles are dispersed in yellow dispersion medium, white particles or black particles are dispersed in blue green dispersion medium, and white particles or black particles are dispersed in purplish red dispersion medium, respectively are arranged in one pixel; color display can be performed.

Next, a display method using an electrophoresis element will be described. Specifically, FIGS. 24A and 24B are used to show a display method of the microcapsules 1170 having two colors of particles. Here, white particles and black particles are used as the two colors of particles, and microcapsules having transparent dispersion medium are shown. Note that particles having another color may be used instead of the black particles of the two colors of particles.

In the microcapsules 1170, when the black particles 1175$a$ are charged positively and the white particles 1175$b$ are charged negatively, voltage is applied to the first conductive layer 1171 and the second conductive layer 1173. As shown in FIG. 24A, when an electric field is generated in a direction from the second conductive layer to the first conductive layer here, the black particles 1175$a$ migrate to the second conductive layer 1173 side, and the white particles 1175$b$ migrate to the first conductive layer 1181 side. Accordingly, when the microcapsules are seen from the first conductive layer 1181 side, white color is observed, and when the microcapsule is seen from the second conductive layer 1173 side, black color is observed.

On the other hand, when voltage is applied in a direction from the first conductive layer 1171 to the second conductive layer 1173 as shown in FIG. 24B, the black particles 1175$a$ migrate to the first conductive layer 1181 side and the white particles 1175$b$ migrate to the second conductive layer 1173 side. Accordingly, when the microcapsule is seen from the first conductive layer 1181 side, white color is observed, and when the microcapsule is seen from the second conductive layer 1173 side, white color is observed.

Next, a display method of the microcapsules 1330 having the white particle and the colored dispersion medium is shown. Although an example in which a dispersion medium is colored in black is shown here, a dispersion medium colored in another color can be similarly used.

In the microcapsules 1330, when the white particles 1332 are charged negatively, voltage is applied to the first conductive layer 1181 and the second conductive layer 1173. As shown in FIG. 24C, when an electric field is generated in a direction from the second conductive layer to the first conductive layer here, the white particles 1332 migrate to the first conductive layer 1181 side. Accordingly, when the microcapsules are seen from the first conductive layer 1181 side, white color is observed, and when the microcapsules are seen from the second conductive layer 1173 side, black color is observed.

On the other hand, as shown in FIG. 24D, when voltage is applied in a direction from the first conductive layer to the second conductive layer, the white particles 1332 migrate to the second conductive layer 1173 side. Accordingly, when the microcapsules are seen from the first conductive layer 1181 side, white is observed, and when the microcapsules are seen from the second conductive layer 1173 side, black is observed.

Although an electrophoresis element is used for description here, a display device using a twist ball display method may be used instead of the electrophoresis element. A twist ball display method means a method in which a spherical particle which is white on one hemispherical surface and black on the other hemispherical surface is arranged between the first conductive layer and the second conductive layer, and a potential difference is generated between the first conductive layer and the second conductive layer to control a direction of the spherical particle, so that display is performed.

As a switching element, MIM (Metal-Insulator-Metal), a diode, and the like can be used instead of a thin film transistor.

A display device having an electrophoresis element and a display device using a twist ball display method keep a state similar to when voltage is applied, for a long term after a field effect transistor is removed. Therefore, a display state can be held even after the power is turned off. Accordingly, low power consumption is possible.

Through the above steps, a semiconductor device which includes an electrophoresis element can be manufactured.

Embodiment 4

The following will describe an example of a display panel (an EL display panel, a liquid crystal display panel, an electrophoresis display panel) manufactured in accordance with Embodiment Modes 1 to 3, in which a semiconductor layer is formed using an amorphous semiconductor or SAS (semi-amorphous silicon) and a scan line driver circuit is formed over a substrate.

Figure 25:
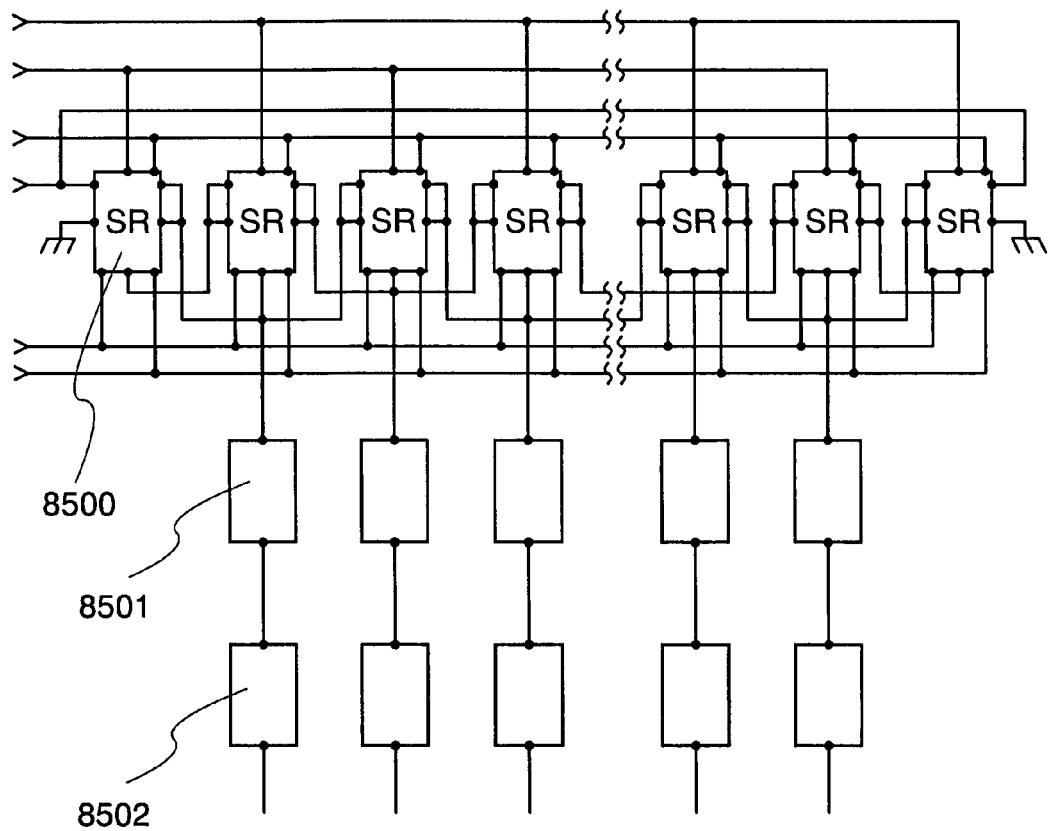
FIG. 25 is a diagram illustrating a circuit configuration of a case where a scan line driver circuit in a display panel of the present invention is formed from TFTs.

FIG. 25 is a block diagram of a scan line driver circuit formed using an n-channel TFT that uses an SAS with an electron field-effect mobility of 1 to 15 $cm^2$/V·sec.

In FIG. 25, a block 8500 corresponds to a pulse output circuit outputting sampling pulses for one stage. A shift register includes n number of pulse output circuits. Reference numeral 8501 denotes a buffer circuit and a pixel 8502 is connected to the buffer circuit.

Figure 26:
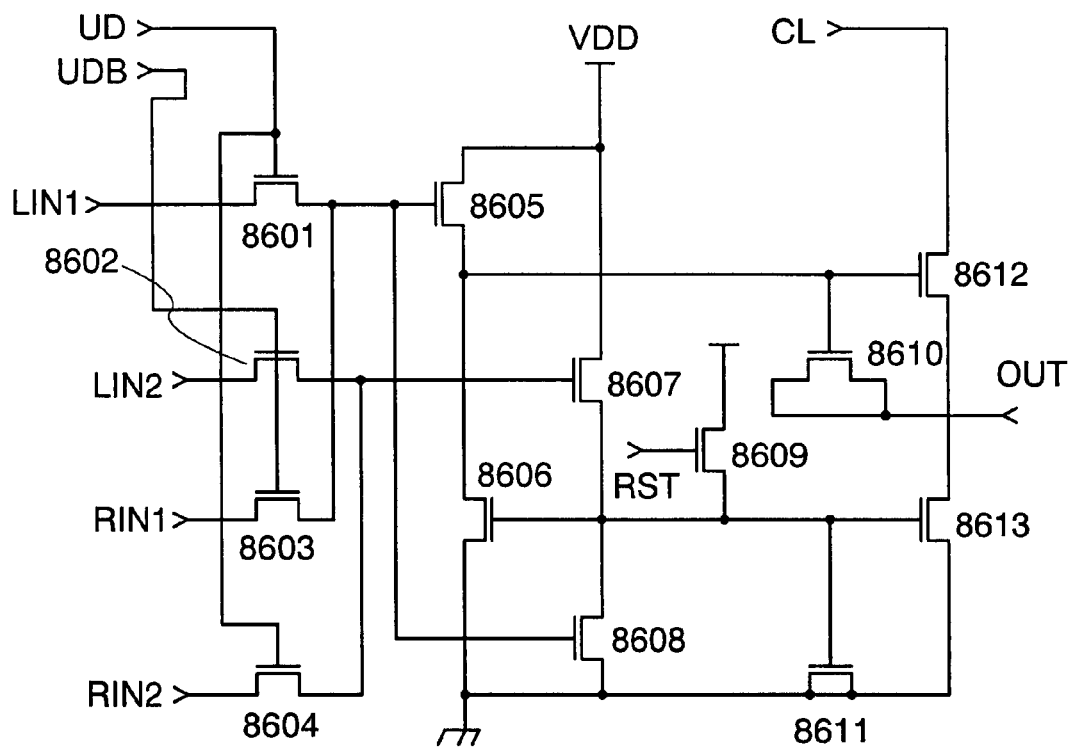
FIG. 26 is a diagram illustrating a circuit configuration of a case where a scan line driver circuit in a display panel of the present invention is formed from TFTs (a shift register circuit)

FIG. 26 shows a specific configuration of the pulse output circuit 8500, where the circuit includes n-channel TFTs 8601 to 8613. In this case, the sizes of the TFTs may be determined in consideration of operation characteristics of the n-channel TFTs using an SAS. For example, when the channel length is set to be 8 µm, the channel width can be set to be in the range of 10 to 80 µm.

Figure 27:
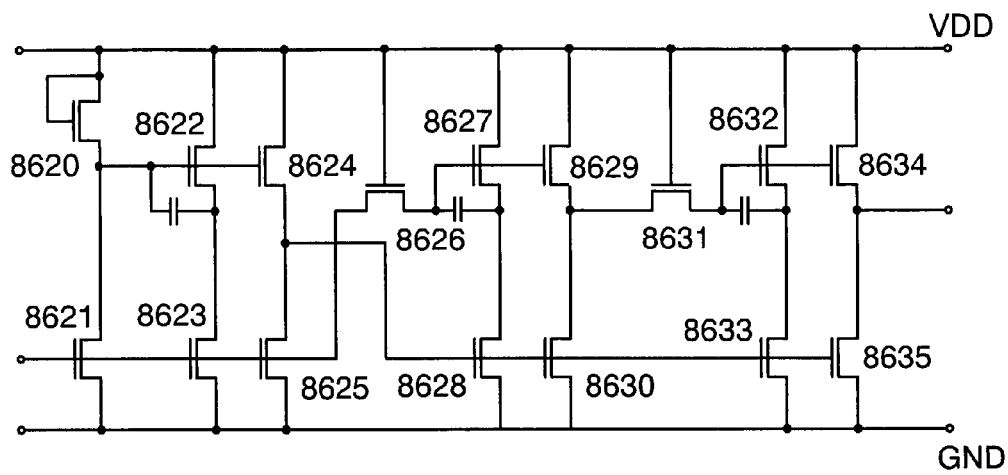
FIG. 27 is a diagram illustrating a circuit configuration of a case where a scan line driver circuit in a display panel of the present invention is formed from TFTs (a buffer circuit)

Further, a specific configuration of the buffer circuit 8501 is shown in FIG. 27. Similarly, the buffer circuit includes n-channel TFTs 8620 to 8635. In this case, the sizes of the TFTs may be determined in consideration of operation characteristics of the n-channel TFTs using an SAS. For example, when the channel length is set to be 10 µm, the channel width can be set to be in the range of 10 to 1800 µm.

In order to realize such a circuit, TFTs are necessary to be connected to one another with a wiring.

As described above, a driver circuit can be incorporated into a display panel.

Next, mounting of a driver circuit on the display panel shown in the aforementioned embodiments will be described with reference to FIGS. 28A to 28C.

Figure 28A:
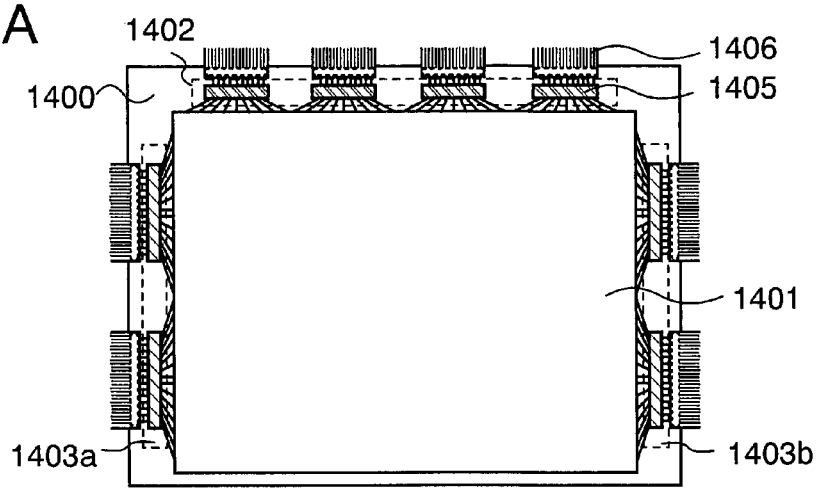
FIGS. 28A to 28C are top views illustrating a semiconductor device of the present invention.

As shown in FIG. 28A, a source line driver circuit 1402 and gate line driver circuits 1403a and 1403b are mounted on the periphery of a pixel portion 1401. In FIG. 28A, as the source line driver circuit 1402 and the gate line driver circuits 1403a and 1403b, an IC chip 1405 is mounted on a substrate 1400 by a known mounting method such as a method using an anisotropic conductive adhesive or an anisotropic conductive film, COG, wire bonding, reflow treatment using a solder bump, or the like. In this embodiment, the IC chip 1405 is mounted by COG, and connected to an external circuit through an FPC (Flexible Printed Circuit) 1406.

A part of the source line driver circuit 1402, for example an analog switch, may be formed on the substrate and the other part may be separately mounted using an IC chip.

Figure 28B:
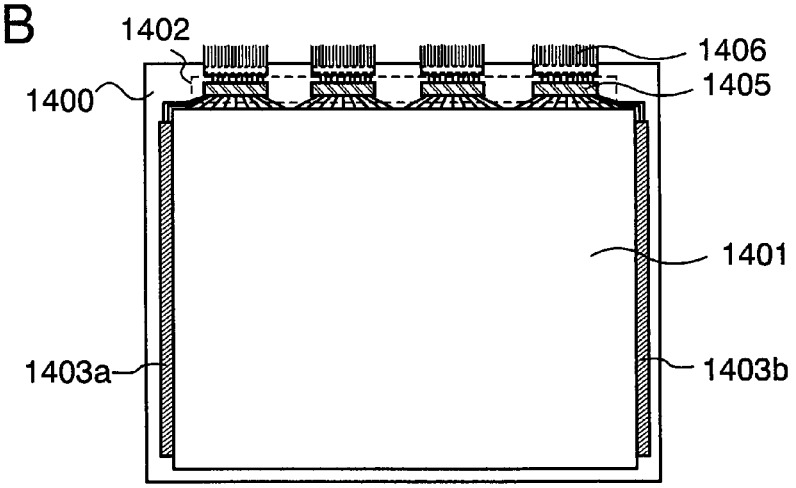

In the case where a TFT is formed of an SAS or a crystalline semiconductor as shown in FIG. 28B, the pixel portion 1401, the gate line driver circuits 1403a and 1403b, and the like may be formed on the substrate while the source line driver circuit 1402 and the like may be separately mounted as IC chips. In FIG. 28B, the IC chip 1405 as the source line driver circuit 1402 is mounted on the substrate 1400 by COG. The IC chip 1405 is connected to an external circuit through the FPC 1406.

A part of the source line driver circuit 1402, for example an analog switch, may be formed on the substrate and the other part may be separately mounted using an IC chip.

Figure 28C:
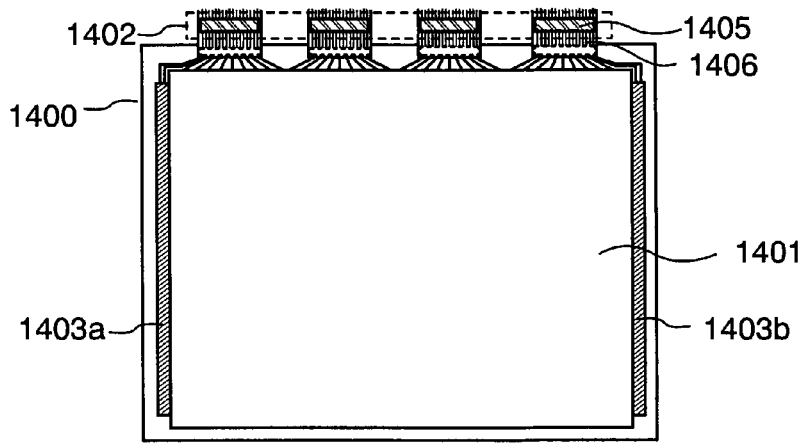

Further, as shown in FIG. 28C, the source line driver circuit 1402 and the like may be mounted by TAB instead of COG. The IC chip is connected to an external circuit through the FPC 1406. Although the source line driver circuit is mounted by TAB in FIG. 28C, the gate line driver circuit may be mounted by TAB.

When the IC chip is mounted by TAB, the pixel portion can occupy a large area in the substrate, leading to a narrower frame.

Instead of an IC chip formed over a silicon wafer, an IC (hereinafter referred to as a driver IC) formed over a glass substrate may be provided. Since IC chips are formed from a circular silicon wafer, the shape of a mother substrate is limited. Meanwhile, a driver IC is formed over a glass substrate whose shape is not limited, which results in increased productivity. Accordingly, the shape and size of a driver IC can be determined freely. For example, when forming a driver IC with a long side of 15 to 80 mm, a smaller number of driver ICs are required as compared to the case of mounting IC chips. As a result, the number of connecting terminals can be reduced and productive yield can be increased.

A driver IC can be formed using a thin film transistor having a crystalline semiconductor layer formed over a substrate, and the crystalline semiconductor may be formed by irradiation using a continuous wave laser beam. A semiconductor layer obtained by irradiation using a continuous wave laser beam has few crystal defects and large crystal grains. Accordingly, a thin film transistor having such a semiconductor film is improved in mobility and response, capable of operating at high speed, and suitable for a driver IC.

Figure 29:
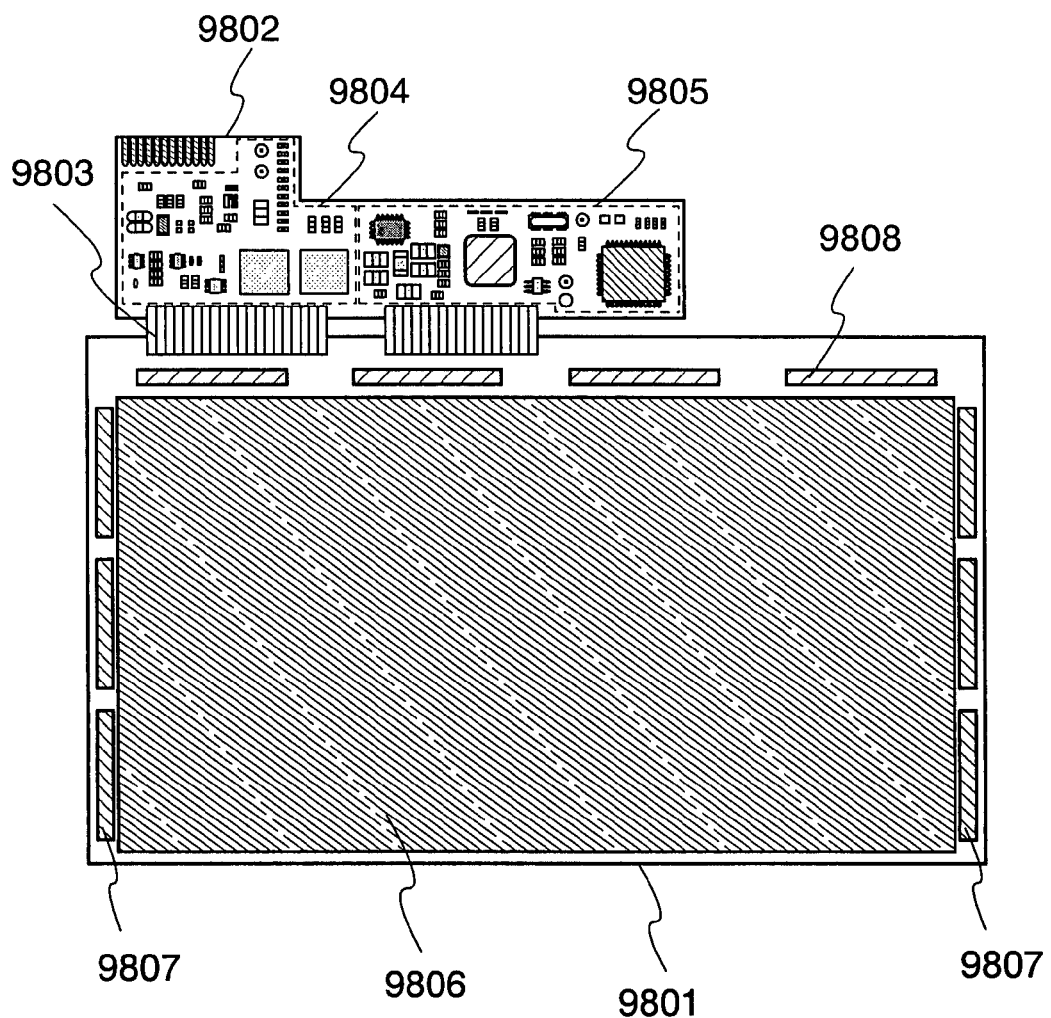
FIG. 29 is a top view of a semiconductor device of the present invention.

In this embodiment, a module having the display panel shown in the aforementioned embodiments is described with reference to FIG. 29. FIG. 29 shows a module including a display panel 9801 and a circuit board 9802. For example, a control circuit 9804, a signal division circuit 9805 and the like are mounted on the circuit board 9802. The display panel 9801 is connected to the circuit board 9802 through a connecting wire 9803. As the display panel 9801, the liquid crystal panel, the light emitting display panel, the electrophoresis display panel, and the like, which have been described in Embodiments 1 to 3 may be used as appropriate.

The display panel 9801 has a pixel portion 9806 where a light emitting element is provided in each pixel, a gate line driver circuit 9807, and a source line driver circuit 9808 that supplies a video signal to a selected pixel. The pixel portion 9806 has the same structure as that shown in Embodiments 1 to 3. As the gate line driver circuit 9807 and the source line driver circuit 9808, IC chips are mounted on the substrate by a method such as a mounting method using an anisotropic conductive adhesive or an anisotropic conductive film, COG, wire bonding, reflow treatment using a solder bump, or the like.

In accordance with this embodiment, a display module having a display panel can be formed with high yield.

Embodiment 5

The semiconductor device shown in the aforementioned embodiment modes and embodiments may be applied to electronic apparatuses such as a television set (also simply referred to as a television or a television receiver), cameras such as a digital camera and a digital video camera, a mobile phone unit (also simply referred to as a mobile phone set or a mobile phone), a portable information terminal such as a PDA, a portable game machine, a monitor for a computer, a computer, a sound reproducing device such as a car audio system, and an image reproducing device provided with a recording medium, such as a home game machine. Specific example of them will be described with reference to FIGS. 30A to 30F.

Figure 30A:
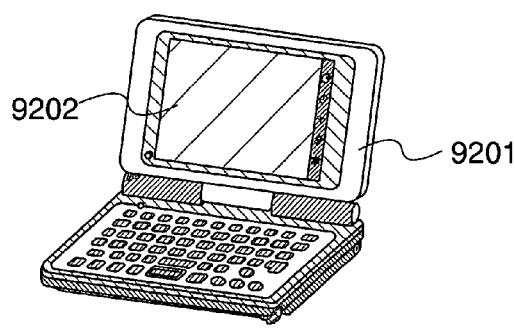
FIGS. 30A to 30F are perspective views each illustrates an electronic device using a semiconductor device of the present invention.

A mobile information terminal shown in FIG. 30A includes a main body 9201, a display portion 9202, and the like. Using the semiconductor device shown in the above embodiment modes or embodiments for the display portion 9202, the mobile information terminal can be provided at low price.

Figure 30B:
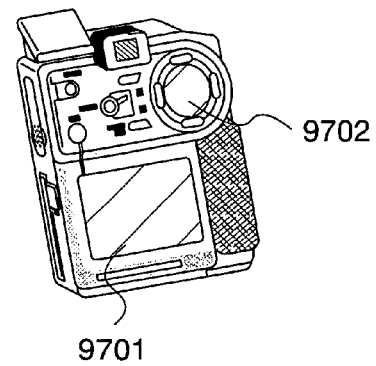

A digital video camera shown in FIG. 30B includes a display portion 9701, a display portion 9702, and the like. Using the semiconductor device shown in the above embodiment modes or embodiments for the display portion 9701, the digital video camera can be provided at low price.

Figure 30C:
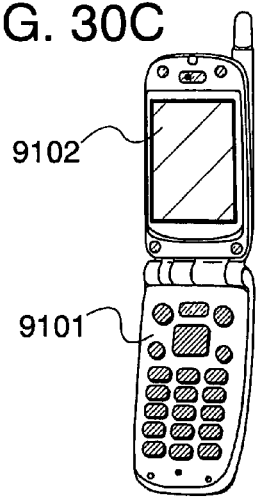

A mobile terminal shown in FIG. 30C includes a main body 9161, a display portion 9102, and the like. Using the semiconductor device shown in the above embodiment modes or embodiments for the display portion 9102, the mobile terminal can be provided at low price.

Figure 30D:
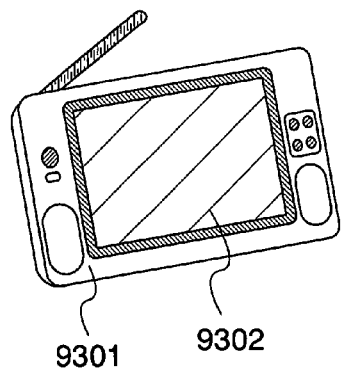

A mobile television device shown in FIG. 30D includes a main body 9301, a display portion 9302, and the like. Using the semiconductor device shown in the above embodiment modes or embodiments for the display portion 9302, the mobile television device can be provided at low price. Such a television device can be widely applied to a small-sized device to be mounted to a mobile terminal such as a mobile phone, a middle-sized device that is portable, and a large-sized device (for example, 40 inches or more).

Figure 30E:
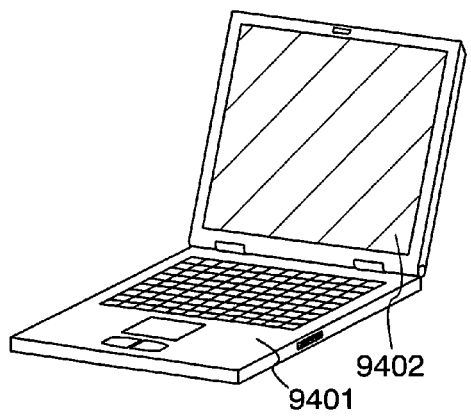

The mobile computer shown in FIG. 30E includes a main body 9401, a display portion 9402, and the like. Using the semiconductor device shown in the above embodiment modes or embodiments for the display portion 9402, the mobile computer can be provided at low price.

Figure 30F:
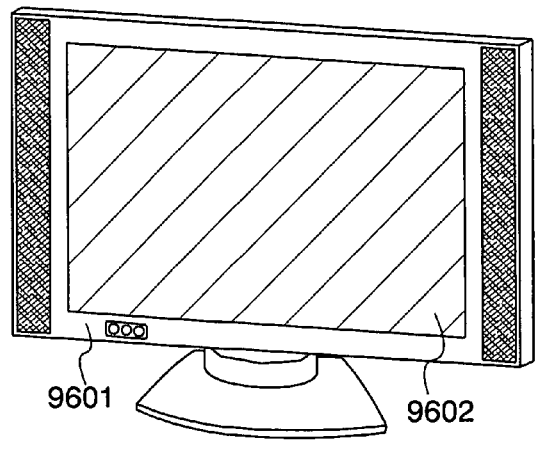

The television device shown in FIG. 30F includes a main body 9601, a display portion 9602, and the like. Using the semiconductor device shown in the above embodiment modes or embodiments for the display portion 9602, the television device can be provided at low price.

Here, the structure of the television device will be explained with reference to FIG. 31

Figure 31:
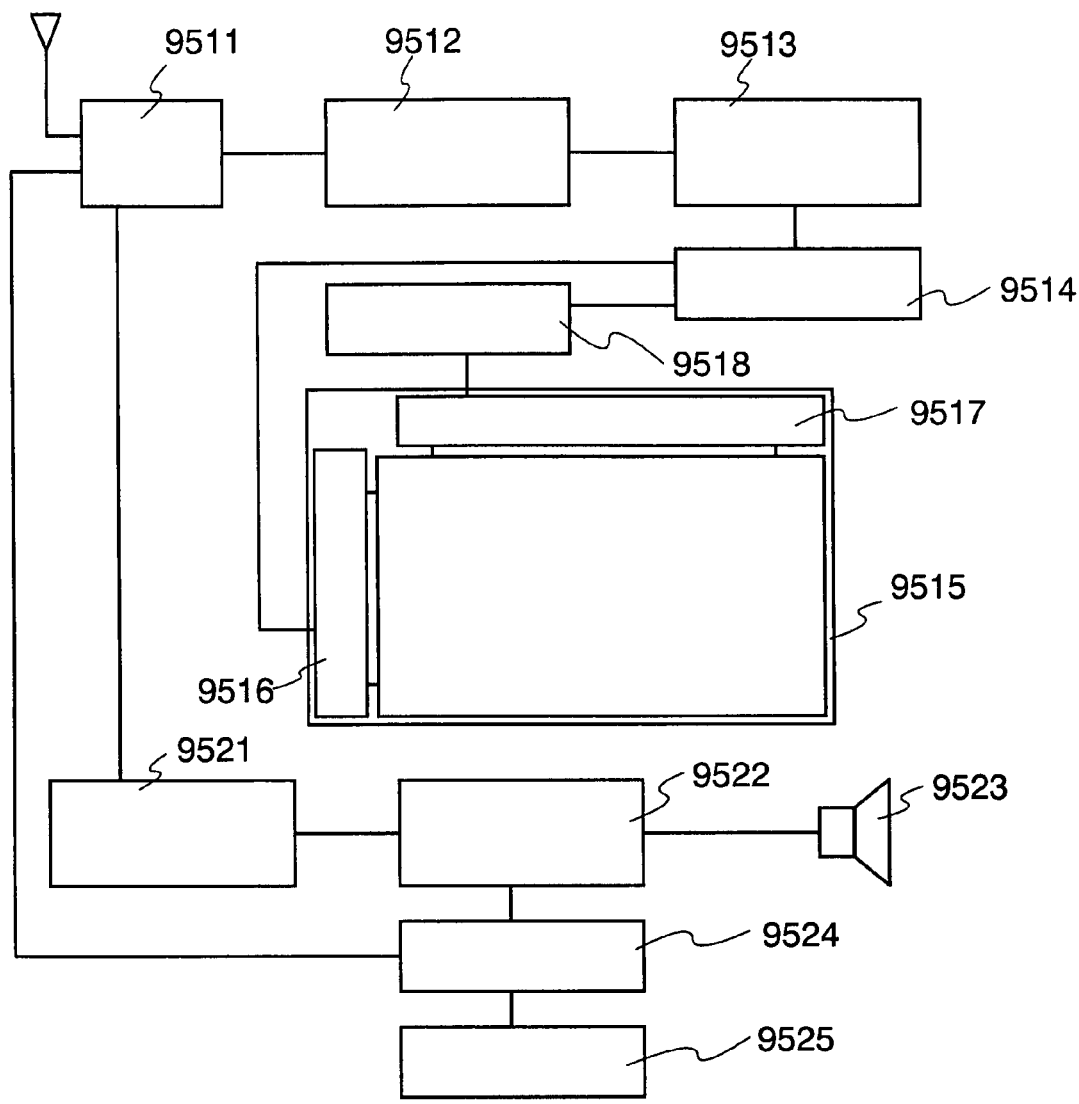
FIG. 31 is a diagram illustrating an electronic device using a semiconductor device of the present invention.

FIG. 31 is a block diagram showing the main structure of the television device. A tuner 9511 receives a video signal and an audio signal. The video signal is processed through a video detecting circuit 9512, a video signal processing circuit 9513 which converts the signal outputted from the video detecting circuit 9512 into a color signal corresponding to red, green, or blue, and a controlling circuit 9514 which converts the video signal in accordance with input specification of a driver IC. In the controlling circuit 9514, signals are outputted to a scan line driver circuit 9516 and a signal line driver circuit 9517 of a display panel 9515. In a case of digital driving, a signal dividing circuit 9518 may be provided on a signal line side so that the inputted digital signal is divided into m number of signals to be supplied.

Among the signals received by the tuner 9511, the audio signal is sent to an audio detecting circuit 9521 and its output is supplied to a speaker 9523 through an audio signal processing circuit 9522. The controlling circuit 9524 receives control information of a receiving station (receiving frequency), sound volume, and the like from an input portion 9525 and sends signals to the tuner 9511 and the audio signal processing circuit 9522.

The television device is formed so as to include the display panel 9515; therefore, the television device can be made to consume less electric power.

The present invention is not limited to the television receiver and is applicable to a display medium particularly with a large area such as an information display board at a railway station, an airport, or the like, or an advertisement display board on the street as well as a monitor of a personal computer.

This application is based on Japanese Patent Application serial No. 2006-206505 filed in Japan Patent Office on Jul. 28 in 2006, the entire contents of which are hereby incorporated by reference.

What is claimed is:

1. A method of manufacturing a semiconductor device, comprising the steps of:
    forming a first layer which absorbs light over one face of a first substrate;
    forming a second layer over the first layer;
    providing a second substrate over the second layer;
    providing a mask in contact with the other face of the first substrate; and
    transferring a part of the second layer to the second substrate by irradiating the first layer with a laser beam through the mask,
    wherein the mask comprises a microlens array and a light blocking layer, and
    wherein a part of a surface of the microlens array is coated with the light blocking layer.

2. A method of manufacturing a semiconductor device according to claim 1, wherein the first substrate is a light-transmitting substrate.

3. A method of manufacturing a semiconductor device according to claim 1, wherein the first layer is one of a conductive layer and an insulating layer.

4. A method of manufacturing a semiconductor device according to claim 1, wherein the first layer contains at least one of hydrogen and a rare gas.

5. A method of manufacturing a semiconductor device according to claim 1, wherein the first substrate and the second substrate are set in a vacuum atmosphere in the step of transferring the part of the second layer.

6. A method of manufacturing a semiconductor device according to claim 1, wherein the second substrate is heated in the step of transferring the part of the second layer.

7. A method of manufacturing a semiconductor device according to claim 1, further includes a step of forming an element over the second substrate by using the part of the second layer.

8. A method of manufacturing a semiconductor device according to claim 1, further includes a step of forming an element over the second substrate by using the part of the second layer, wherein the element is one of a semiconductor element and a light emitting element.

* * * * *